US010671023B2

(12) United States Patent
Uemura et al.

(10) Patent No.: US 10,671,023 B2
(45) Date of Patent: Jun. 2, 2020

(54) PORTABLE ELECTRONIC APPARATUS AND WRIST APPARATUS

(71) Applicant: SEIKO EPSON CORPORATION, Tokyo (JP)

(72) Inventors: Takehisa Uemura, Shiojiri (JP); Noriaki Hiraide, Shiojiri (JP)

(73) Assignee: SEIKO EPSON CORPORATION, Tokyo (JP)

(*) Notice: Subject to any disclaimer, the term of this patent is extended or adjusted under 35 U.S.C. 154(b) by 0 days.

(21) Appl. No.: 16/032,577

(22) Filed: Jul. 11, 2018

(65) Prior Publication Data

US 2019/0025767 A1 Jan. 24, 2019

(30) Foreign Application Priority Data

Jul. 19, 2017 (JP) ................................ 2017-139732
Feb. 27, 2018 (JP) ................................ 2018-032903

(51) Int. Cl.

| | |
|---|---|
| ***H05K 5/00*** | (2006.01) |
| ***H05K 7/00*** | (2006.01) |
| ***G04C 10/02*** | (2006.01) |
| ***G04G 17/04*** | (2006.01) |
| ***G04G 17/08*** | (2006.01) |
| ***G04G 21/02*** | (2010.01) |
| ***G04G 21/08*** | (2010.01) |
| ***G04R 20/02*** | (2013.01) |

(52) U.S. Cl.

CPC ........... *G04C 10/02* (2013.01); *G04G 17/045* (2013.01); *G04G 17/08* (2013.01); *G04G 21/025* (2013.01); *G04G 21/08* (2013.01); *G04R 20/02* (2013.01)

(58) Field of Classification Search

CPC .................................. H05K 5/00; H05K 7/00

See application file for complete search history.

(56) References Cited

U.S. PATENT DOCUMENTS

| | | | | |
|---|---|---|---|---|
| 2003/0181795 A1 | | 9/2003 | Suzuki et al. | |
| 2012/0120772 A1* | | 5/2012 | Fujisawa ................ | G04C 10/02 368/64 |
| 2014/0085153 A1* | | 3/2014 | Nagahama ............... | H01Q 1/44 343/720 |

FOREIGN PATENT DOCUMENTS

| | | |
|---|---|---|
| JP | 2006-320735 A | 11/2006 |
| JP | 2016-168274 A | 9/2016 |

* cited by examiner

*Primary Examiner* — Jerry Wu

(74) *Attorney, Agent, or Firm* — Oliff PLC

(57) ABSTRACT

A wrist apparatus as a portable electronic apparatus includes a case, a solar battery that is provided in the case and has an outer circumference along the outer edge of the case and an inner circumference the perimeter of which is shorter than that of the outer circumference, and an acceleration sensor that is provided in the case and disposed in a position where the acceleration sensor overlaps with the solar battery in a plan view of light receiving surface of the solar battery.

6 Claims, 10 Drawing Sheets

PORTABLE ELECTRONIC APPARATUS AND WRIST APPARATUS

CROSS-REFERENCE TO RELATED APPLICATIONS

This application claims priority to Japanese Patent Application Nos. JP 2017-139732, filed in the Japanese Patent Office on Jul. 19, 2017, and JP 2018-032903, filed in the Japanese Patent Office on Feb. 27, 2018, the entire disclosures of which are hereby incorporated by reference herein in its entirety.

BACKGROUND

1. Technical Field

The present invention relates to a portable electronic apparatus and a wrist apparatus.

2. Related Art

There is a known portable electronic apparatus that is worn around a wrist with the aid of a band or any other component and has the function of measuring a wearer's (user's) biological information on the pulse wave and other factors and displaying the measured information in the digital form. An electronic apparatus of this type including a solar battery (solar cell) has been put into use. For example, JP-A-2016-168274 discloses a sport watch that incorporates a solar cell and is so operated through a user's operation of a button or any other component that a measurement mode or a display mode relating to marathon or any other activity is selected and information on measured lap time, measured running time, and other pieces of information is displayed in the digital form in a display section. In general, the solar battery is provided along the outer circumference of the display section, which displays time and other pieces of information, in the plan view. The configuration described above allows a sufficient light receiving surface of the solar battery to be provided without hindering the displayed information in the display section.

When the user operates a button of the sport watch described in JP-A-2016-168274, which is an example of the portable electronic apparatus in recent years, during an activity, such as running, it is difficult to visually recognize the button, for example, the user needs to search for the position of the button, in some cases. To solve the problem, a method for tapping the case of the sport watch to select the measurement mode, the display mode, or any other mode has been used. In the tapping method, operation of tapping the case is sensed with an acceleration sensor or any other sensor, but the tapping operation cannot reliably be sensed depending on the position where the acceleration sensor is located.

SUMMARY

An advantage of some aspects of the invention is to increase the precision in detection of tapping operation while providing a sufficient light receiving surface of a solar battery.

The invention can be implemented as the following forms or application examples.

Application Example 1

A portable electronic apparatus according to this application example includes a case having an opening section that opens toward one side, a solar battery provided in the case and having an outer circumference located on the side facing the inner edge of the opening section and an inner circumference the perimeter of which is shorter than that of the outer circumference, and an acceleration sensor provided in the case and disposed in a position where the acceleration sensor overlaps with the solar battery in a plan view along a normal to a light receiving surface of the solar battery.

In the portable electronic apparatus according to this application example, the acceleration sensor is disposed in a position where the acceleration sensor overlaps with the solar battery, which has an outer circumference located on the side facing the inner edge of the opening section and an inner circumference the perimeter of which is shorter than that of the outer circumference, in the plan view along the direction of a normal to the light receiving surface of the solar battery. In other words, since the acceleration sensor is disposed in a position close to the outer circumference (inner edge) of the case, the acceleration sensor can reliably capture and sense vibration produced when the case is tapped. The configuration described above allows a sufficiently wide light receiving surface of the solar battery to be provided and the tapping detection precision to be increased.

Application Example 2

A portable electronic apparatus according to this application example includes a case, a display section incorporated in the case and having a display surface on which information is displayed, a solar battery disposed outside the display surface in a plan view along a normal to the display surface, and an acceleration sensor incorporated in the case and disposed in a position where the acceleration sensor overlaps with the solar battery in the plan view.

In the portable electronic apparatus according to this application example, the acceleration sensor is disposed in a position where the acceleration sensor overlaps with the solar battery, which is disposed outside the display surface of the display section, in the plan view along the direction of a normal to the display section. In other words, since the acceleration sensor is disposed in a position close to the outer circumference (inner edge) of the case, the acceleration sensor can reliably capture and sense vibration produced when the case is tapped. The configuration described above allows a sufficiently wide light receiving surface of the solar battery to be provided and the tapping detection precision to be increased.

Application Example 3

It is preferable that the portable electronic apparatus according to the application example further includes a circuit substrate electrically connected to the acceleration sensor, and that the circuit substrate is so supported that an outer circumference thereof is supported by the case.

According to this application example, since the circuit substrate electrically connected to the acceleration sensor is so supported that the outer circumference thereof is supported by the case, the vibration from the case is likely to be transmitted to the acceleration sensor, whereby the acceleration sensor can sense the tapping operation with increased sensing precision.

Application Example 4

It is preferable that the portable electronic apparatus according to the application example further includes a biological information measuring section that is provided in the case and measures biological information, and that the solar battery is disposed outside an outer edge of the biological information measuring section in the plan view.

According to this application example, the solar battery is disposed outside the outer edge of the biological information measuring section in the plan view. In other words, since the biological information measuring section is disposed in a portion closer to the center of the case than the solar battery in the plan view, the influence of outside light on the biological information measuring section can be suppressed, and the solar battery can be disposed with no decrease in the precision of the detection performed by the biological information measuring section.

Application Example 5

In the portable electronic apparatus according to the application example, it is preferable that the circuit substrate is disposed between the solar battery and the biological information measuring section in a cross section viewed in a direction perpendicular to a direction of a normal to the light receiving surface.

According to this application example, the circuit substrate can block what is called stray light that is produced when part of light intended for power generation and traveling toward the solar battery forms leakage light that enters the case from the side facing the solar battery, for example, through gaps, whereby the influence of the outside light on the biological information measuring section can be reduced.

Application Example 6

In the portable electronic apparatus according to the application example, it is preferable that the circuit substrate has a first surface and a second surface so related to the first surface that the first and second surfaces are front and rear surfaces of the circuit substrate, and that the solar battery and the acceleration sensor are connected to the first surface and the biological information measuring section is connected to the second surface.

According to this application example, the lengths of routed wiring lines for connection between the components described above and the circuit substrate can be minimized, and the circuit substrate can block what is called stray light that is produced when part of light intended for power generation and traveling toward the solar battery forms leakage light that enters the case from the side facing the solar battery, for example, through gaps, whereby the influence of the outside light on the biological information measuring section can be reduced.

Application Example 7

In the portable electronic apparatus according to the application example, it is preferable that the acceleration sensor is mounted on the circuit substrate and disposed in a portion facing the outer circumference of the circuit substrate.

According to this application example, since the acceleration sensor is mounted on the circuit substrate and disposed in a portion facing the outer circumference of the circuit substrate, the vibration from the case is likely to be transmitted to the acceleration sensor, whereby the acceleration sensor can sense the tapping operation with increased sensing precision.

Application Example 8

It is preferable that the portable electronic apparatus according to the application example further includes a secondary battery provided in the case and electrically connected to the solar battery, and that the secondary battery is disposed in a position where the secondary battery does not overlap with the solar battery in the plan view.

According to this application example, the solar battery is unlikely to be affected by heat generated when the secondary battery is charged, so that an increase in the temperature of the solar battery can be suppressed, whereby the power generation efficiency of the solar battery can be increased.

Application Example 9

In the portable electronic apparatus according to the application example, it is preferable that the solar battery has an annular shape in the plan view.

According to this application example, the annular arrangement of the solar battery allows, for example, efficient arrangement of the display area, whereby the exterior appearance of the portable electronic apparatus can be improved.

Application Example 10

It is preferable that the portable electronic apparatus according to the application example further includes a circuit substrate provided in the case, that the circuit substrate has a first surface and a second surface so related to the first surface that the first and second surfaces are front and rear surfaces of the circuit substrate, that the acceleration sensor and an illuminator are provided on the first surface, and that a biological information measuring section that measures biological information is provided on the second surface.

According to this application example, the lengths of routed wiring lines for connection between the components described above and the circuit substrate can be minimized, and the circuit substrate blocks the light outputted from the illuminator, whereby the influence of the stray light on the biological information measuring section can be reduced.

Application Example 11

In the portable electronic apparatus according to the application example, it is preferable that the biological information measuring section includes a light emitter and a light receiver, and that the light emitter is disposed outside the light receiver in the plan view.

According to this application example, the arrangement in which the light receiver is located in a position inside the light emitter can prevent outside light from entering the light receiver, whereby the influence of the outside light on the biological information measuring section can be reduced.

Application Example 12

A wrist apparatus according to this application example includes a case, a display section incorporated in the case and having a display surface on which information is displayed, a solar battery disposed outside the display surface in a plan view along a normal to the display surface, and an acceleration sensor incorporated in the case and disposed in a position where the acceleration sensor overlaps with the solar battery in the plan view.

In the wrist apparatus according to this application example, the acceleration sensor is disposed in a position where the acceleration sensor overlaps with the solar battery, which is disposed outside the display surface of the display section, in the plan view along the direction of a normal to the display section. In other words, since the acceleration sensor is disposed in a position close to the outer circumference (inner edge) of the case, the acceleration sensor can reliably capture and sense vibration produced when the case is tapped. The configuration described above allows a sufficiently wide light receiving surface of the solar battery to be provided and the tapping detection precision to be increased.

BRIEF DESCRIPTION OF THE DRAWINGS

The invention will be described with reference to the accompanying drawings, wherein like numbers reference like elements.

DESCRIPTION OF EXEMPLARY EMBODIMENTS

Figure 1:
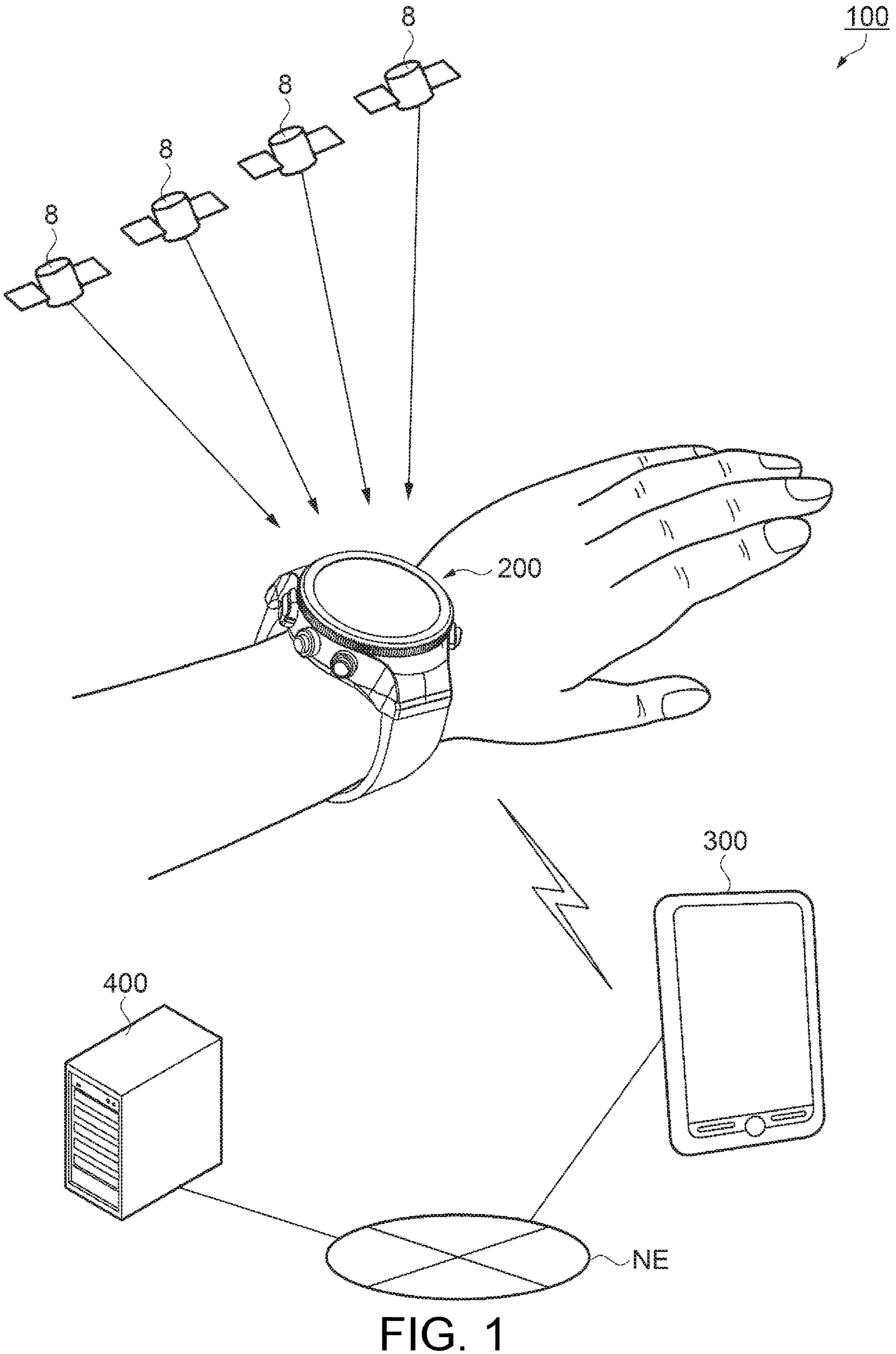
FIG. 1 is a schematic configuration diagram showing an overview of an activity assisting system that incorporates a wrist apparatus as a portable electronic apparatus.

A system according to an embodiment of the invention will be described below. It is not intended that the embodiment described below unduly limits the contents of the invention set forth in the appended claims. Further, all configurations described in the embodiment are not necessarily essential configuration requirements of the invention.

1. Approach of Present Embodiment

An activity assisting system as an example of the system that incorporates a portable electronic apparatus according to the embodiment of the invention will first be described. In the following description, as an example of the portable electronic apparatus, a wrist apparatus (wearable apparatus) including, for example, a pulse wave sensor and a body motion sensor and worn around a user's wrist will be described by way of example.

The wrist apparatus as the portable electronic apparatus used in the activity assisting system includes a solar battery on the side where a display section is provided and further includes a pulse wave sensor that acquires pulse wave information as the user's biological information and a body motion sensor that acquires the user's action information. The wrist apparatus further includes a GPS (global positioning system) as an example of a positioning system using position information satellites and called, for example, a global navigation satellite system (GNSS) that acquires information on the user's position. The portable electronic apparatus is not limited to a wrist apparatus and may instead be a wearable apparatus worn on the neck, an ankle, or any other user's body part.

The pulse wave sensor as an example of a biological information measuring section can acquire the pulse rate and other pieces of pulse wave information. The pulse wave sensor can, for example, be a photoelectric sensor (optical sensor). In this case, it is conceivable to use, for example, an approach for irradiating a living body with light and detecting the light reflected off or passing through the living body with the photoelectric sensor. Since the amount of radiated light absorbed by or reflected off the living body varies in accordance with the amount of blood flowing through a blood vessel, sensor information detected with the photoelectric sensor produces a signal corresponding, for example, to the amount of blood flow, and analysis of the signal allows acquisition of information on the beat. The pulse wave sensor is not limited to a photoelectric sensor and may instead be an electrocardiograph, an ultrasonic sensor, or any other sensor.

The photoelectric sensor (optical sensor) needs to receive necessary light and block unnecessary light. In the case of a pulse wave sensor, it is necessary to receive light reflected off a subject that is a target object under measurement (body part containing blood vessel under measurement, in particular) and containing a pulse wave component but block the remaining light that forms noise components.

The body motion sensor is a sensor that detects the user's body motion. Conceivable examples of the body motion sensor may include an acceleration sensor, an angular velocity sensor, an orientation sensor (geomagnetism sensor), and a pressure sensor (altitude sensor). The body motion sensor may instead be any other sensor.

The GPS is also called a global positioning system and is a satellite positioning system for measuring the user's current position on the earth based on a plurality of satellite signals. The GPS has the function of performing positioning calculation by using GPS time information and orbit information to acquire information on the user's position and a time correction function as one of the functions of the timepiece.

2. Activity Assisting System

The configuration of the activity assisting system that incorporates the wrist apparatus as the portable electronic apparatus will next be described with reference to FIG. 1. FIG. 1 is a schematic configuration diagram showing an overview of the activity assisting system that incorporates the wrist apparatus as the portable electronic apparatus.

An activity assisting system 100 according to the present embodiment includes a wrist apparatus 200, which serves as the portable electronic apparatus, which is a detector including a pulse wave sensor as a biological sensor (photoelectric sensor), an acceleration sensor as the body motion sensor, the GPS, and other components, a portable apparatus 300 as an activity assistant, and a server 400 as an information processor connected to the portable apparatus 300 over a network NE, as shown in FIG. 1.

The GPS as the global navigation satellite system provided in the wrist apparatus 200 has the function of receiving electronic waves from GPS satellites 8 to correct internal time of the wrist apparatus 200 and the function of performing positioning calculation to acquire position information. The GPS satellites 8 are each an example of a position information satellite that goes along a predetermined orbit around the earth up in the sky and each transmit a high-frequency electric wave on which a navigation message has been superimposed to the ground. In the following description, the electric wave on which a navigation message has been superimposed is called a satellite signal.

The satellite signal from each of the GPS satellites 8 contains GPS time information, which is extremely accurate, and time correction parameters for correcting a time error. The wrist apparatus 200 can receive the satellite signal (electric wave) transmitted from one of the GPS satellites 8 and use the GPS time information and the time correction parameters contained in the satellite signal to acquire time information.

The satellite signal further contains orbit information representing the on-orbit position of the GPS satellite 8. The wrist apparatus 200 can use the GPS time information and the orbit information to perform the positioning calculation. The positioning calculation is performed on the assumption that the internal time of the wrist apparatus 200 contains an error of a certain degree. That is, in addition to parameters x, y, and z for identifying the three-dimensional position of the wrist apparatus 200, the time error is also unknown. The wrist apparatus 200 can therefore receive the satellites signals (electric waves) transmitted from, for example, at least three of the GPS satellites 8 and use the GPS time information and the orbit information contained in the satellite signals to perform the positioning calculation for acquisition of information on the position of the user's current location.

The portable apparatus 300 as the activity assistant can, for example, be a smartphone or a tablet terminal. The portable apparatus 300 is connected to the wrist apparatus 200, which includes the pulse wave sensor as the biological sensor, which is a photoelectric sensor, and the acceleration sensor as the body motion sensor, over short-range wireless communication, which can, for example, be Bluetooth (registered trademark) communication, or wired communication (not shown). The portable apparatus 300 can receive measurement information from the wrist apparatus 200 and notify processed information on the user's pulse wave and body motion, the position information, or other pieces of information. It is, however, noted that the portable apparatus 300 can be embodied in a variety of forms. For example, the portable apparatus 300 may include an optical sensor section 40, a body motion sensor section 170 or a GPS receiver 160, which are provided in the wrist apparatus 200 and will be described later.

The wrist apparatus 200 and the portable apparatus 300 in the present embodiment each have the Bluetooth function, and the portable apparatus 300 and the wrist apparatus 200 are connected to each other over Bluetooth communication, for example, Bluetooth Low Energy (also called Bluetooth 4.0). Bluetooth Low Energy, in which power saving is regarded as important, allows significant power saving as compared with conventional Bluetooth versions, whereby the wrist apparatus can be used for a prolonged period.

The portable apparatus 300 can further be connected to the server 400, such as a PC (personal computer) and a server system, over the network NE. The network NE in this case can be a WAN (wide area network), a LAN (local area network), a mobile phone communication circuit, short-range wireless communication, or any of a variety of other networks NE. In this case, the server 400 is achieved as a processor/storage that receives the information on the pulse wave and body motion measured by the wrist apparatus 200 and the data processed by the portable apparatus 300 from the portable apparatus 300 over the network NE and stores the received information.

In the embodiment described above, the wrist apparatus 200 only needs to be communicable with the portable apparatus 300 and does not need to be directly connected to the network NE. The configuration of the wrist apparatus 200 can therefore be simplified. It is, however, noted that the activity assisting system 100 can employ a variation in which the portable apparatus 300 is omitted and the wrist apparatus 200 and the server 400 are directly connected to each other. In this case, the wrist apparatus 200 has the functions of the portable apparatus 300, that is, the function of processing the measurement information and the function of transmitting the measurement information to the server 400 and receiving information from the server 400.

The activity assisting system 100 is not limited to a system achieved by the configuration including the server 400. For example, the processes carried out by the activity assisting system 100 and the functions provided by the activity assisting system 100 may be achieved by the portable apparatus 300. The portable apparatus 300, such as a smartphone, which has restricted processing performance, storage area, and battery capacity in many cases as compared with a server system, is believed to be capable of providing sufficient processing performance and the other requirements in consideration of improvement in performance in recent years. Therefore, as long as the processing performance and the other requirements are satisfied, the processes carried out and the functions provided by the activity assisting system 100 according to the present embodiment can be achieved by the portable apparatus 300 alone.

Further, the activity assisting system 100 according to the present embodiment is not limited to a system achieved by the three units. For example, the activity assisting system 100 may include at least two of the wrist apparatus 200, the portable apparatus 300, and the server 400. In this case, the processes carried out by the activity assisting system 100 may be carried out by any one of the units or may be carried out by the plurality of units in a distributed manner. Further, no restriction on inclusion of an apparatus other than the wrist apparatus 200, the portable apparatus 300, and the server 400 is imposed on the activity assisting system 100 according to the present embodiment. Moreover, in consideration of improvement in terminal performance, terminal usage form, and other factors, an embodiment in which the wrist apparatus 200 achieves the activity assisting system 100 according to the present embodiment can be employed.

Further, the activity assisting system 100 according to the present embodiment includes a memory that stores information (program and various data, for example) and a processor that operates based on the information stored in the memory. The processor may achieve the function of each portion of the activity assisting system 100 with the aid of individual hardware or unitary hardware. The processor may, for example, be a central processing unit (CPU). The processor is, however, not limited to a CPU and can instead be a GPU (graphics processing unit), a DSP (digital signal processor), or any of a variety of other processors. The processor may still instead be an ASIC-based hardware circuit. The memory may, for example, be an SRAM (static random access memory), a DRAM (dynamic random access memory), or any other semiconductor memory, a register, a hard disk drive or any other magnetic storage, or an optical disk drive or any other optical storage. For example, the memory stores computer readable instructions, and the processor executes the instructions to achieve the functions of the portions of the activity assisting system 100. The instructions may be instructions that form a program or may be instructions that instruct the hardware circuit of the processor to operate.

3. Wrist Apparatus

Figure 2:
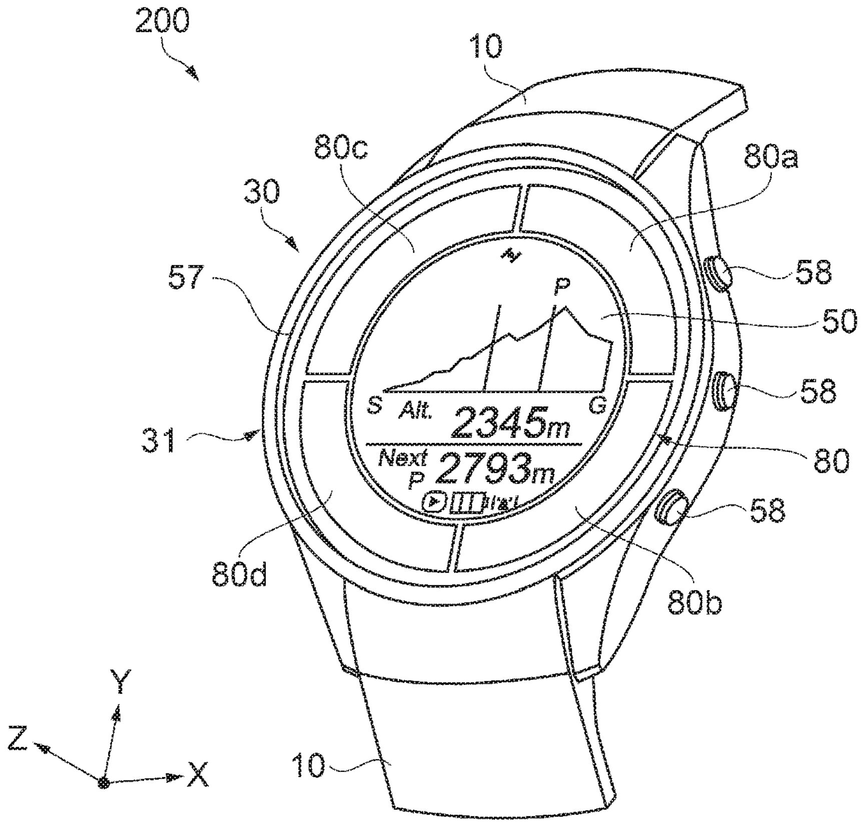
FIG. 2 is an exterior perspective view showing a schematic configuration of the wrist apparatus viewed from the side facing the front side thereof (display surface side).
Figure 3:
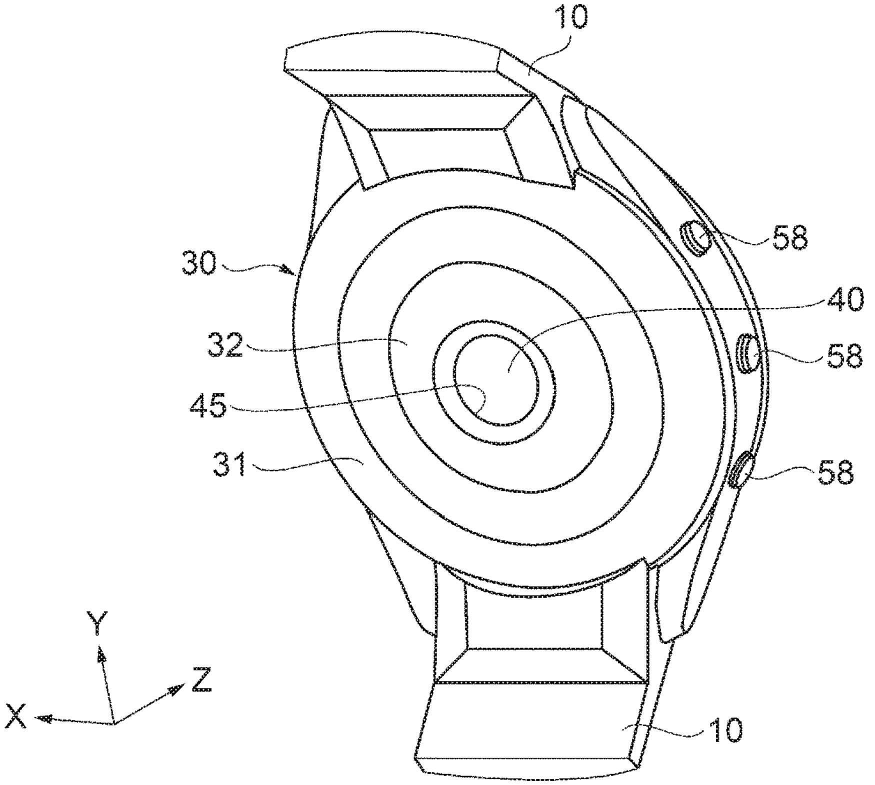
FIG. 3 is an exterior perspective view showing the schematic configuration of the wrist apparatus viewed from the side facing the rear side thereof.
Figure 4:
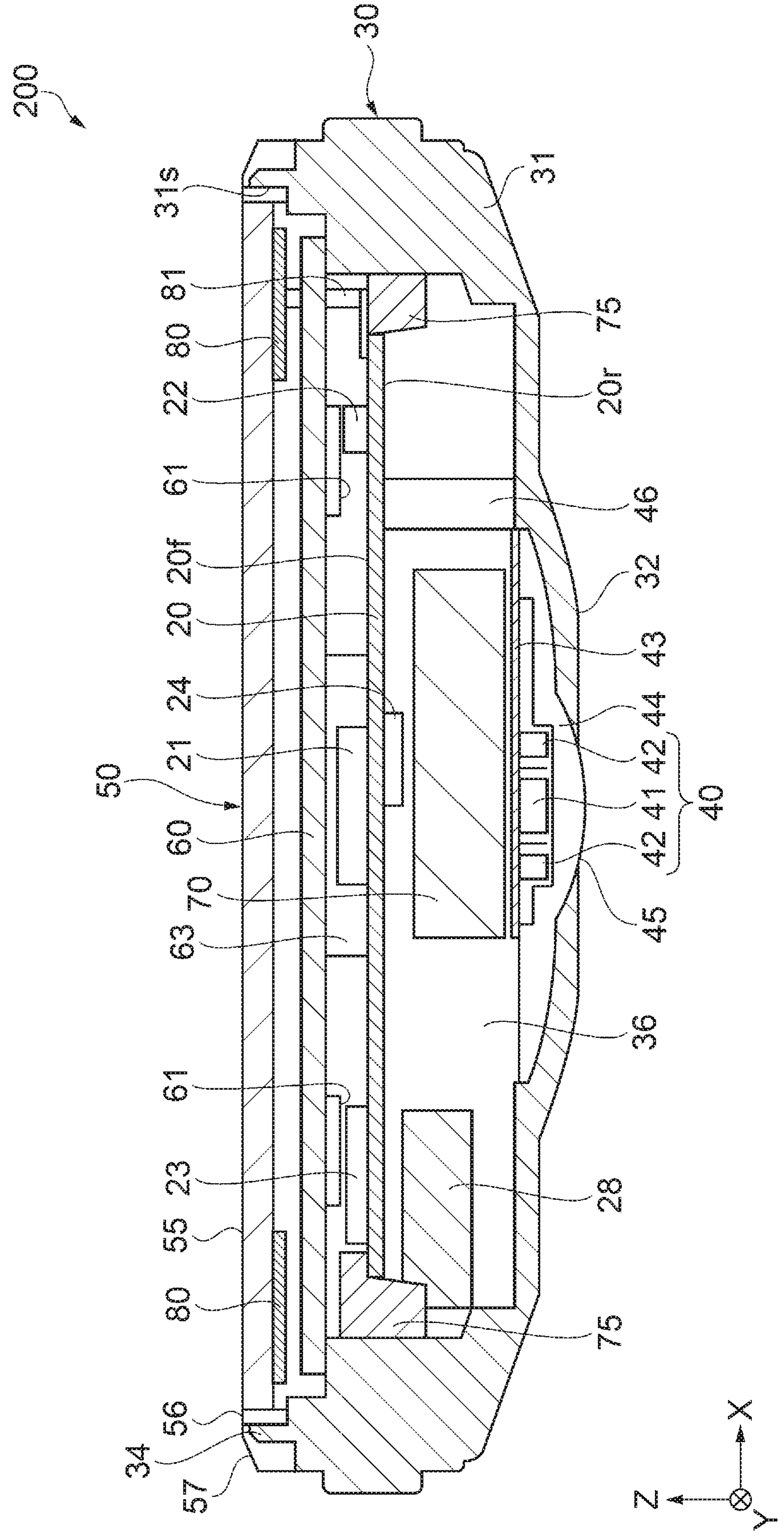
FIG. 4 is a cross-sectional view showing the configuration of the wrist apparatus.
Figure 5A:
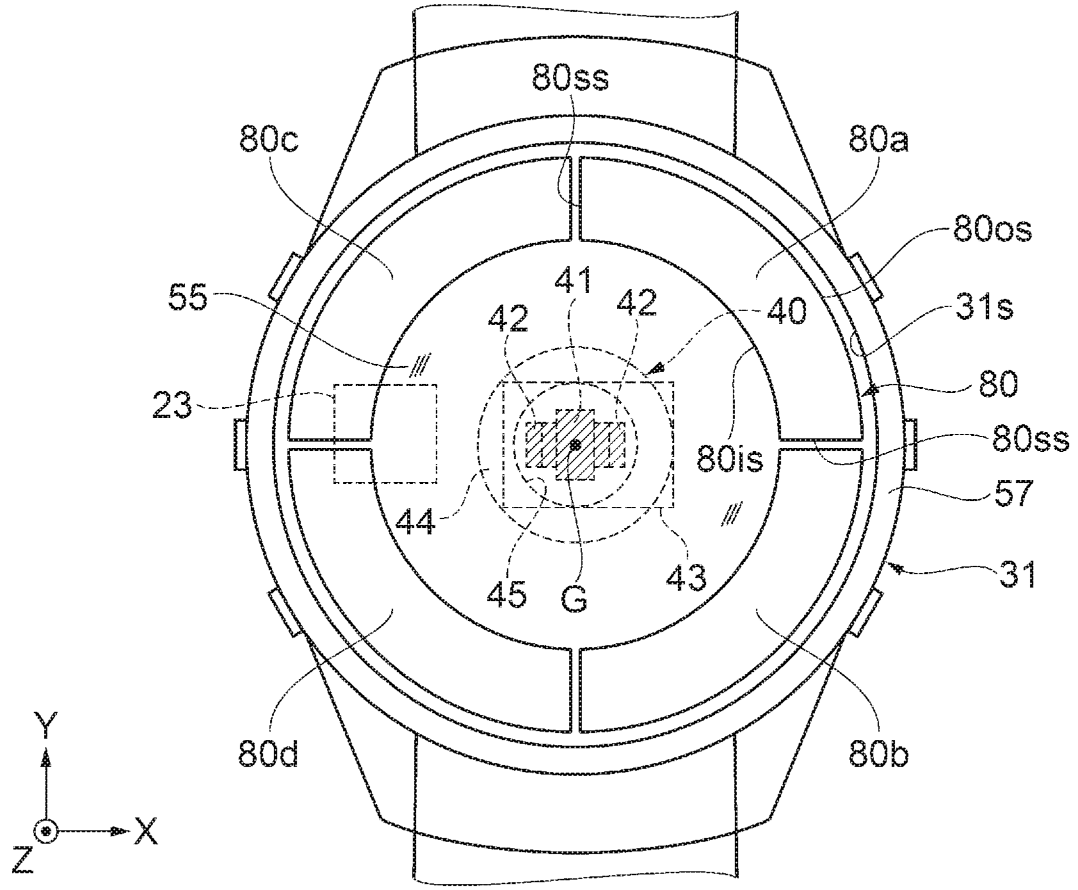
FIG. 5A is a plan view showing the configuration of the wrist apparatus.
Figure 6:
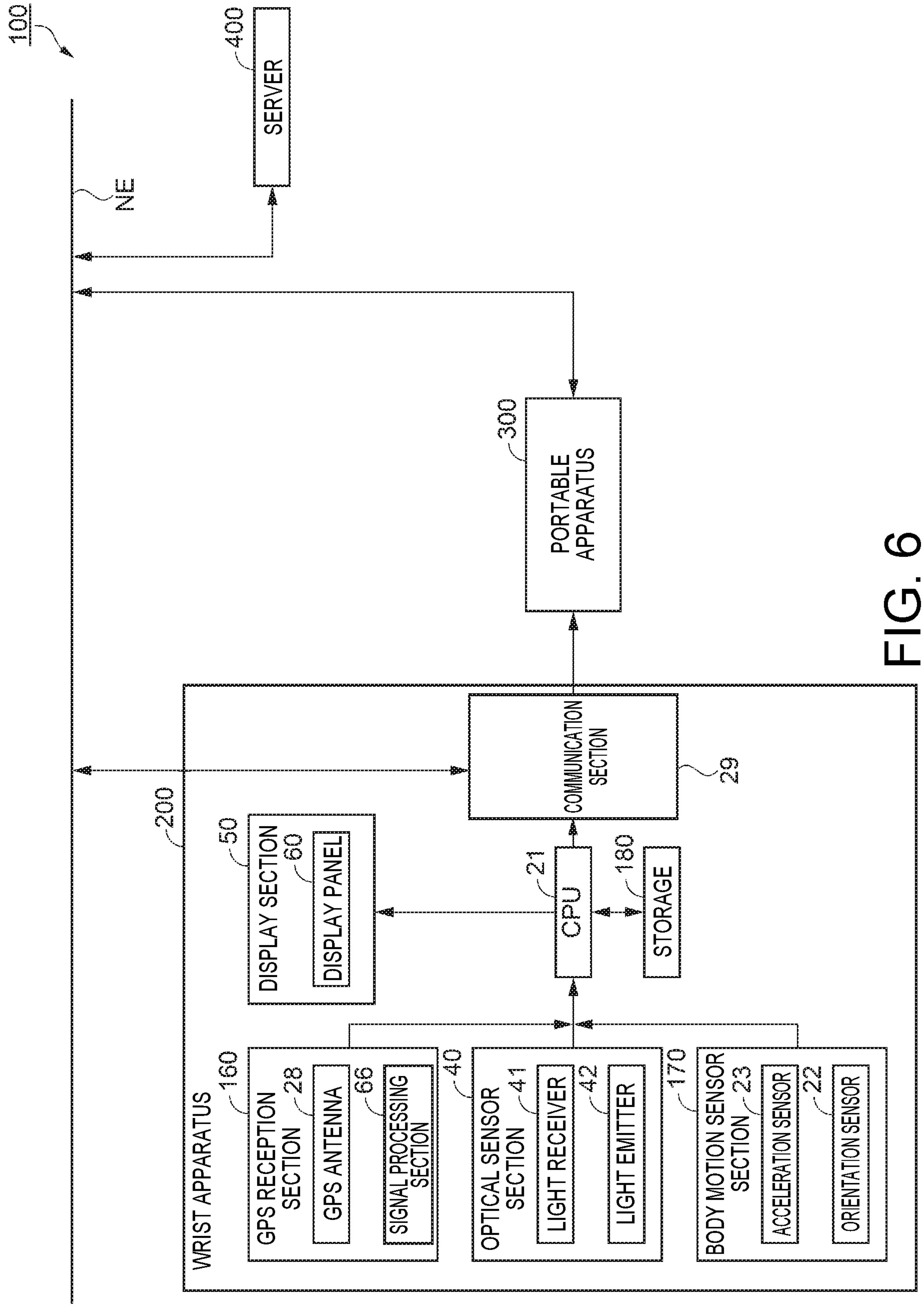
FIG. 6 is a functional block diagram showing a schematic configuration of the wrist apparatus.
Figure 7:
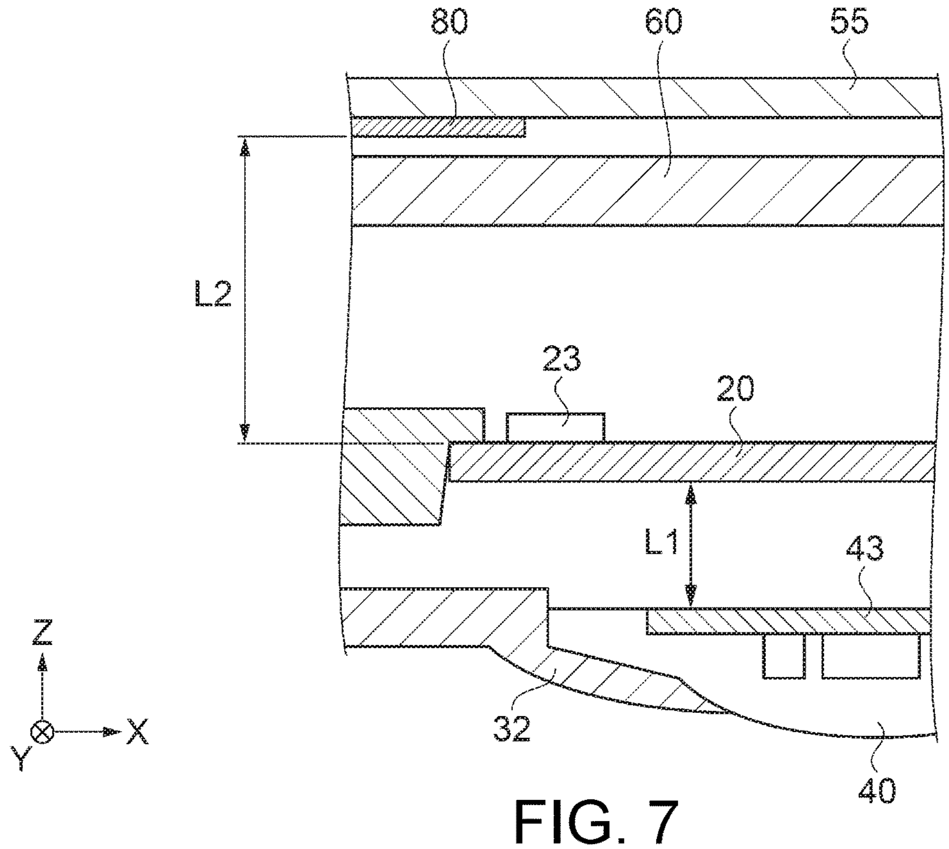
FIG. 7 is a partial cross-sectional view showing a first example of the arrangement of components of the wrist apparatus.
Figure 8:
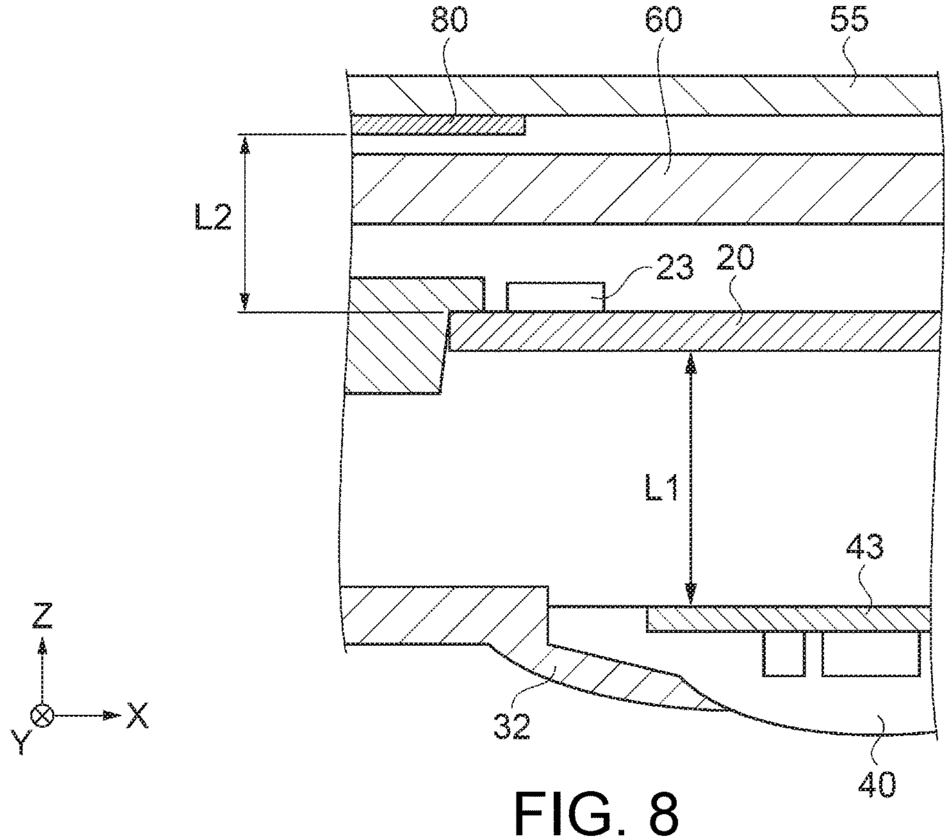
FIG. 8 is a partial cross-sectional view showing a second example of the arrangement of the components of the wrist apparatus.

The configuration of the wrist apparatus (measurement apparatus) as the portable electronic apparatus will next be described with reference to FIGS. 2, 3, 4, 5A, 6, 7, and 8. FIG. 2 is an exterior perspective view showing a schematic configuration of the wrist apparatus viewed from the side facing the front side thereof (display surface side). FIG. 3 is an exterior perspective view showing the schematic configuration of the wrist apparatus viewed from the side facing the rear side thereof. FIG. 4 is a cross-sectional view showing the configuration of the wrist apparatus. FIG. 5A is a plan view showing the configuration of the wrist apparatus. FIG. 6 is a functional block diagram showing the schematic configuration of the wrist apparatus. FIG. 7 is a partial cross-sectional view showing a first example of the arrangement of components of the wrist apparatus. FIG. 8 is a partial cross-sectional view showing a second example of the arrangement of the components of the wrist apparatus.

In the following description of the wrist apparatus 200, in a situation in which the user wears an apparatus body 30, the side facing a target object that is a body part under measurement, for example, of biological information is called "a rear side or a rear surface side," and the display surface side of the apparatus body 30, which is the side opposite the target object side, is called "a front side or a front surface side." A "target object (target body part)" under measurement is called a "subject" in some cases. A coordinate system is set with respect to a case 31 of the wrist apparatus 200 with the origin of the coordinate system set at the center of the display surface of a display section 50, and the display surface of the display section 50 is called the front surface. Under the definition described above, a direction that intersects the display surface of the display section 50 and extends from the rear surface toward the front surface of the display section 50 is called a Z-axis positive direction (+Z-axis direction). The Z-axis positive direction may instead be defined to be a direction extending from the optical sensor section 40 toward the display section 50 or the direction away from the case 31 along a normal to light receiving surfaces 80*a*, 80*b*, 80*c*, and 80*d* of panels that form a solar battery 80. In the state in which the wrist apparatus 200 is worn on a subject, the Z-axis positive direction described above corresponds to the direction from the subject toward the case 31. Two axes perpendicular to the Z axis are called X and Y axes, and the Y axis, in particular, is so set as to coincide with the direction in which band sections 10 are attached to the case 31. The light receiving surfaces 80*a*, 80*b*, 80*c*, and 80*d* are each a surface via which light enters the solar battery 80. In the present specification, the display section 50 collectively represents regions which are visually recognizable through a windshield 55 in the +Z-axis direction and where information is displayed on a liquid crystal display (display panel 60). The display surface of the display section 50 is a surface located on the front side (side where windshield 55 is disposed) of the liquid crystal display (display panel 60).

FIG. 2 is a perspective view of the wrist apparatus 200, with the band sections 10 fixed thereto, viewed in the +Z-axis direction or from the front side (side facing display section 50) opposite the rear side or the subject side in the state in which the wrist apparatus 200 is worn. FIG. 3 is a perspective view of the wrist apparatus 200 viewed in the −Z-axis direction or from the rear side opposite the viewing side in FIG. 2. FIG. 4 is a cross-sectional view of the wrist apparatus 200 viewed in the +Y-axis direction. FIG. 5A is a plan view of the wrist apparatus 200 viewed in the +Z-axis direction.

The wrist apparatus 200 as the portable electronic apparatus is worn on the user's predetermined body part (body part under measurement, for example, wrist), as shown in FIGS. 2, 3, and 4 and detects the pulse wave information, the body motion information, the position information, and other pieces of information. The wrist apparatus 200 includes the apparatus body 30, which includes the case 31 and detects the pulse wave information, the body motion information, and other pieces of information with the apparatus body 30 being in intimate contact with the user, and the pair of band sections 10, which are attached to the apparatus body 30 and allow the user to wear the apparatus body 30.

The apparatus body 30 including the case 31 is provided with the display section 50, the solar battery 80, which has an annular shape and having the light receiving surfaces 80*a*, 80*b*, 80*c*, and 80*d* of the panels disposed in an outer edge portion of the display section 50 and oriented in the +Z-axis direction, and a measurement window 45, which corresponds to the optical sensor section 40 (see FIG. 4) as the biological information measuring section. The display section 50 may be so disposed as to overlap with part of the solar battery 80 in a plan view in the +Z-axis direction (direction of normal to light receiving surfaces 80*a*, 80*b*, 80*c*, and 80*d*). It is, however, noted that the solar battery 80 is so disposed as not to overlap with the region (display surface) where information is displayed on the liquid crystal display (display panel 60). A plurality of operation sections (operation buttons) 58 are provided on the outer side surface of the apparatus body 30, and a bezel 57 is so provided and disposed as to annularly surround the outer edge of the display section 50. It is, however, noted that the wrist apparatus 200 does not necessarily have the configuration described above and can be changed in a variety of manners. For example, part of the components described above can be omitted, and another component can be added to the wrist apparatus 200.

The apparatus body 30 includes the case 31, which has an opening section 31*s*, which opens toward the front side. The rear side of the case 31, specifically, a top portion of a convex section 32, which protrudes from the rear surface or the rear-side surface of the case 31, is provided with the measurement window 45 of the optical sensor section 40. In the plan view in the +Z-axis direction, the optical sensor section 40 as the biological information measuring section is disposed in a position corresponding to the measurement window 45, and a transparent cover 44 is inserted into the measurement window 45. The transparent cover 44 may protrude from the top portion of the convex section 32. Further, in the plan view in the +Z-axis direction, the measurement window 45 is preferably located in a position where the measurement window 45 does not overlap with the solar battery 80. The arrangement in which the measurement window 45 of the optical sensor section 40 is located in a position where the measurement window 45 does not overlap with the solar battery 80 increases the distance from the outer circumferential edge of the case 31 to the optical sensor section 40, and outside light is therefore unlikely to reach the optical sensor section 40, whereby entrance of outside light into the measurement window 45 can be suppressed, and decrease in precision of the detection performed by the optical sensor section 40 can therefore be avoided.

The case 31 can be made, for example, of stainless steel or any other metal or a resin material. The case 31 is not limited to a unitary case and may have a configuration in which the case 31 is divided into a plurality of portions. For example, the case 31 may have a twin-body structure in which a case back is provided on the side worn on the user.

The apparatus body 30 is provided with the bezel 57 along the outer edge of the opening section 31*s*, which is formed in the case 31 and located on the front side of the apparatus body 30, and on the side facing the outer circumference of a protruding section 34, which protrudes upright in the +Z-axis direction, and the windshield (glass plate in present example) 55, which is provided inside the bezel 57 and is a transparent plate as a top plate portion that protects the internal structure of the apparatus body 30. The windshield 55 is so disposed as to close the opening of the case 31 in the plan view in the direction that intersects the light receiving surfaces 80*a*, 80*b*, 80*c*, and 80*d* of the solar battery 80 at right angles, in other words, in the +Z-axis direction. The windshield 55 is attached to the inner edge side of the protruding section 34 of the case 31 via a bonding member 56, such as a gasket or an adhesive. An internal space 36, which is a closed space, is provided in the case 31 and surrounded by the case 31 and the windshield 55, which closes the opening of the case 31.

The windshield 55 is not limited to a glass plate and can instead be made, for example, of a transparent plastic material or any material other than glass as long as the windshield 55 is a light transmissive member that allows observation of the display section 50 and is strong enough to be able to protect element parts accommodated in the internal space 36, such as the liquid crystal display (display panel 60) that forms the display section 50.

The internal space 36 in the case 31 accommodates the following element parts that form the wrist apparatus 200: a circuit substrate 20; an orientation sensor 22 and an acceleration sensor 23 contained in the body motion sensor section 170 (see FIG. 6); a GPS antenna 28; the optical sensor section 40; the liquid crystal display (hereinafter referred to as display panel 60) that forms the display section 50; an illuminator 61, which illuminates the display panel 60; a secondary battery 70 (lithium secondary battery); the solar battery 80; and other components, as shown in FIG. 4. The apparatus body 30, however, does not necessarily have the configuration shown in FIG. 4. For example, an atmospheric pressure sensor for calculating the altitude and other parameters, an air temperature sensor for measuring the temperature, and other sensors, a vibrator, and other components may be added to the configuration shown in FIG. 4. The following components are connected to the circuit substrate 20: wiring lines connected to the element parts described above; a CPU (central processing unit) 21, which serves as a processing section including a control circuit including a control circuit, a drive circuit, and other components that control the sensors, the display section 50, and other components that form the wrist apparatus 200; and another circuit element 24. The CPU 21 as the processing section can process signals detected with the sensors, for example, the optical sensor section 40 and the acceleration sensor 23. The orientation sensor 22 and the acceleration sensor 23 may be connected to the circuit substrate 20.

Out of the element parts that are arranged in the internal space 36 and form the wrist apparatus 200, the circuit substrate 20, the optical sensor section 40, the display panel 60, the secondary battery 70, and the solar battery 80 are disposed in the following order from the side facing the windshield 55 in the −Z-axis direction: the solar battery 80; the display panel 60; the circuit substrate 20; the secondary battery 70; and the optical sensor section 40. The solar battery 80 is so disposed as to cover at least part of the display section 50.

The configuration described above in which the display panel 60, which forms the display section 50, is disposed between the solar battery 80 and the circuit substrate 20 in the case 31 allows the user to readily visually recognize information displayed in the display section 50 without the circuit substrate 20 blocking the displayed information.

Further, the configuration in which the display panel 60, which forms the display section 50, is disposed between the solar battery 80 and the optical sensor section 40 in the case 31 allows the display panel 60 to block what is called stray light that is produced when part of light intended for power generation and traveling toward the solar battery 80 forms leakage light that enters the case 31 from the side facing the solar battery 80, for example, through gaps, whereby the influence of the outside light (stray light) on the optical sensor section 40 can be reduced.

Further, the configuration in which the secondary battery 70 is disposed between the display section 50 and the optical sensor section 40 in the case 31 allows the secondary battery 70 to block the stray light, which is produced when part of the light incident for power generation enters the case 31 from the side facing the solar battery 80, whereby the influence of the outside light on the optical sensor section 40 can be reduced.

In the cross-sectional view viewed in the −Y-axis direction, which is the direction perpendicular to the +Z-axis direction (direction of normal to light receiving surfaces 80*a*, 80*b*, 80*c*, and 80*d*), the circuit substrate 20, the optical sensor section 40, and the solar battery 80 are preferably so disposed that the distance L1 between the circuit substrate 20 and the optical sensor section 40 (shortest distance between circuit substrate 20 and optical sensor section 40) is shorter than the distance L2 between the circuit substrate 20 and the solar battery 80 (shortest distance between circuit substrate 20 and solar battery 80), as shown in FIG. 7. When the distance L2 between the circuit substrate 20 and the solar battery 80 increases as described above, the solar battery 80 is unlikely to be affected by heat generated by the circuit substrate 20 or any other component thereon. That is, an increase in the temperature of the solar battery 80 can be suppressed, whereby a decrease in power generation efficiency of the solar battery 80 can be suppressed.

Instead, in the cross-sectional view viewed in the −Y-axis direction, which is the direction perpendicular to the +Z-axis direction (direction of normal to light receiving surfaces 80*a*, 80*b*, 80*c*, and 80*d*), the circuit substrate 20, the optical sensor section 40, and the solar battery 80 may be so disposed that the distance L1 between the circuit substrate 20 and the optical sensor section 40 (shortest distance between circuit substrate 20 and optical sensor section 40) is longer than the distance L2 between the circuit substrate 20 and the solar battery 80 (shortest distance between circuit substrate 20 and solar battery 80), as shown in FIG. 8. When the distance L2 between the circuit substrate 20 and the solar battery 80 decreases as described above, the amount of the electric power generated by the solar battery 80 but lost during the transmission of the electric power can be suppressed, whereby the electricity charge efficiency can be increased.

The configuration in which the circuit substrate 20 is disposed between the solar battery 80 and the optical sensor section 40 in the case 31 allows the circuit substrate 20 to block what is called stray light that is produced when part of the light intended for power generation and traveling toward the solar battery 80 forms leakage light that enters the case 31 from the side facing the solar battery 80, for example, through gaps, whereby the influence of the outside light (stray light) on the optical sensor section 40 can be reduced.

The element parts will each be described below with reference also to the functional block diagram shown in FIG. 6.

The circuit substrate 20 has a front surface 20*f*, which serves as a first surface, and a rear surface 20*r*, which serves as a second surface, is so related to the front surface 20*f* that they are front and rear surfaces of the circuit substrate 20, and is a surface opposite the front surface 20*f*. The outer-circumferential-side end of the circuit substrate 20 is attached to a circuit case 75, which is a circuit fixing section, and the circuit substrate 20 is supported by the inner side of the case 31 via the circuit case 75. On the front surface 20*f* of the circuit substrate 20 are mounted the orientation sensor 22 and the acceleration sensor 23, which serve as the sensors accommodated in the body motion sensor section 170, the CPU 21, which serves as the control circuit, and other components, and the components mounted on the front surface 20*f* are electrically connected to each other. Since the outer circumference of the circuit substrate 20 is supported by the case 31, vibration from the case 31 is likely to be transmitted to the acceleration sensor 23, which is connected to the circuit substrate 20, whereby tapping operation and other types of operation can be sensed with the acceleration sensor 23 with increased precision. Further, the other circuit element 24 and other components are electrically connected to and mounted on the rear surface 20*r* of the circuit substrate 20.

The display panel 60 and the solar battery 80 are connected to the front surface 20*f* of the circuit substrate 20 via a connection wiring section 63 and a connection wiring section 81, respectively, which are each formed, for example, of a flexible substrate. The optical sensor section 40 is electrically connected to the rear surface 20*r* of the circuit substrate 20, which is the surface opposite the front surface 20*f*, via a connection wiring section 46, which is formed, for example, of a flexible substrate. The arrangement described above allows the lengths of routed wiring lines for the connection between the components described above and the circuit substrate 20 to be minimized and allows the circuit substrate 20 to block the stray light, which is produced when the light incident for power generation forms leakage light that enters the case from the side facing the solar battery 80, whereby the influence of the outside light on the optical sensor section 40 can be reduced. The circuit case 75 can guide the secondary battery 70 and other components.

The orientation sensor (geomagnetism sensor) 22 and the acceleration sensor 23 accommodated in the body motion sensor section 170 can detect information on the user's body motion, that is, the body motion information. The orientation sensor (geomagnetism sensor) 22 and the acceleration sensor 23 each output a body motion detection signal that is a signal changing in accordance with the user's movement, turnaround, and other types of body motion and transmit the signal to the CPU 21, which serves as the processing section including the control circuit. The acceleration sensor 23 can not only sense the user's action, such as the user's movement, but sense, for example, what is called a tapping action that is the user's action of tapping with a fingertip an outer circumferential portion of the case 31, the windshield 55, or any other portion to apply light impact to the case 31 for expression of the user's intention of operation.

The acceleration sensor 23 is preferably disposed in a position where at least part of the acceleration sensor 23 overlaps with the solar battery 80 in the plan view in the +Z-axis direction, as shown in FIG. 5A. In other words, the acceleration sensor 23 is preferably mounted on the outer circumferential side of the circuit substrate 20, in other words, in a position close to the inner wall (inner circumference) of the case. When the acceleration sensor 23 is disposed as described above, the impact produced, for example, by the tapping action performed on the case 31 is likely to propagate to the acceleration sensor 23 via the circuit substrate 20, the outer circumference of which is supported by the case 31, whereby the precision of the sensing performed by the acceleration sensor 23 can be further increased.

The CPU 21 as the processing section forms, for example, the control circuit, which control a circuit that controls the GPS reception section 160 including the GPS antenna 28, a circuit that drives the optical sensor section 40 to measure the pulse wave, a circuit that drives the display section 50 (display panel 60), a circuit that drives the body motion sensor section 170 and processes a signal detected by the body motion sensor section 170 to acquire the body motion information, and a power generation circuit in the solar battery 80. The CPU 21 then transmits the pulse wave information and the body motion information each detected at a body part, information on the user's position, or any other piece of information to a communication section 29 as required.

The GPS antenna 28 is accommodated along with a signal processing section 66 in the GPS reception section 160 and receives a plurality of satellite signals. The signal processing section 66 performs the positioning calculation based on the plurality of satellite signals received via the GSP antenna 28 to acquire the information on the user's position.

The communication section 29 transmits the pulse wave information and the body motion information or the information on the user's position transmitted from the CPU 21 to the portable apparatus 300 and other components as required.

The optical sensor section 40 as the biological information measuring section detects, for example, the pulse wave and includes a light receiver 41 and a plurality of (two in present embodiment) light emitters 42 disposed on opposite sides of the light receiver 41, in other words, outside the light receiver 41 in the plan view (outer circumferential side of case 31). The arrangement in which the light receiver 41 is located in between the light emitters 42 can prevent outside light that enters the case 31 through the outer circumference thereof from entering the light receiver 41, whereby the influence of the outside light on the optical sensor section 40 can be reduced. The number of light emitters 42 is not limited to two and may instead be one or three or greater. The light receiver 41 and the two light emitters 42 are attached to one surface of a sensor substrate 43 and covered with the transparent cover 44, which is formed of a light transmissive member that is made, for example, of a photocurable resin. The transparent cover 44, specifically, a portion including a region corresponding to the light receiver 41 and the two light emitters 42 is inserted into the measurement window 45 provided in the case 31. The transparent cover 44 may protrude beyond the top portion of the convex section 32 of the case 31.

The optical sensor section 40 can detect pulse wave information based on the configuration in which a subject (target object under measurement) is irradiated with the light emitted from the light emitters 42 and the reflected light is received with the light receiver 41, as described above. The optical sensor section 40 outputs, as a pulse detection signal, a signal detected with the pulse wave sensor including the light emitters 42 and the light receiver 41. The optical sensor section 40 is, for example, formed of a photoelectric sensor. In this case, it is conceivable to employ, for example, an approach for irradiating a living body (user's wrist) with the light from the light emitters 42 and detecting the light reflected off or passing through the living body with the light receiver 41. In this approach, since the amount of radiated light absorbed by or reflected off the living body varies in accordance with the amount of blood flowing through a blood vessel, sensor information detected with the photoelectric sensor produces a signal corresponding, for example, to the amount of blood flow, and analysis of the signal allows acquisition of information on the beat. The pulse wave sensor is not limited to a photoelectric sensor and may instead be an electrocardiograph, an ultrasonic sensor, or any other sensor.

The optical sensor section 40 is disposed in a position where the optical sensor section 40 does not overlap with the solar battery 80, which is formed in an annular shape, in the plan view in the direction that intersects the light receiving surfaces 80*a*, 80*b*, 80*c*, and 80*d* of the solar battery 80 at right angles (+Z-axis direction), as shown in FIG. 5A. In other words, the solar battery 80 is disposed outside the outer edge of the optical sensor section 40 and is therefore disposed in a position where the solar battery 80 and the optical sensor section 40 do not overlap with each other in the plan view in the +Z-axis direction. In still other words, the solar battery 80 is disposed between the bezel 57 and the optical sensor section 40 in the plan view in the +Z-axis direction. The outer edge of the optical sensor section 40 is preferably the outer edge of the hatched region shown in FIG. 5A at least containing the outer edges of the light receiver 41 and the two light emitters 42 and formed of the outer edges connected to each other. In the present embodiment, the outer edge of the measurement window 45, which contains the light receiver 41 and the two light emitters 42, can be the outer edge of the optical sensor section 40. The outer edge of the sensor substrate 43 may instead be the outer edge of the optical sensor section 40. Still instead, the outer edge of the transparent cover 44 may be the outer edge of the optical sensor section 40. The configuration in which the optical sensor section 40 is surrounded by the solar battery 80 can include a configuration in which the optical sensor section 40 is surrounded by a plurality of solar batteries 80, that is, the solar battery 80 may be divided into a plurality of portions or may have cutouts. The configuration in which "the optical sensor section 40 is surrounded by the solar battery 80" can be defined as follows: Perpendiculars are drawn to the outer edge of the optical sensor section 40 in the plan view in the +Z-axis direction; and at least 50% of the optical sensor section allows the perpendiculars to intersect the solar battery 80. The configuration in which "the optical sensor section 40 is surrounded by the solar battery 80" can instead be defined as follows: A concentric circle is drawn around the center of gravity of the optical sensor section 40 in the plan view in the +Z-axis direction; and at least 50% of the circumference of the concentric circle overlaps with the solar battery 80.

As described above, the annularly arranged solar battery 80 is so disposed outside the outer edge of the optical sensor section 40 as to surround the optical sensor section 40 in the plan view in the +Z-axis direction. In other words, the configuration in which the optical sensor section 40 is disposed in a central portion of the case 31 in the plan view can suppress the influence of the outside light (leakage light) on the optical sensor section 40. The solar battery 80 can therefore be disposed with no decrease in precision of the detection performed by the optical sensor section 40. Further, since the solar battery 80 is disposed outside the outer edge of the optical sensor section 40 in the plan view, the optical sensor section 40 and the solar battery 80 are so arranged in a further well-balanced manner that the optical sensor section 40 readily performs the sensing and the solar battery 80 efficiently generates electric power, whereby the apparatus body 30 of the wrist apparatus 200 can be worn on the user in an improved manner. The outer edge of the transparent cover 44 may instead be the outer edge of the optical sensor section 40. The configuration in which "the optical sensor section 40 does not overlap with the solar battery 80" refers to a situation in which an area S, where the solar battery 80 and the optical sensor section 40 overlap with each other in the plan view in the +Z-axis direction, is zero. The configuration in which "the optical sensor section 40 is surrounded by the solar battery 80" can include a configuration in which the optical sensor section 40 is surrounded by a plurality of solar batteries 80, that is, the solar battery 80 may be divided into a plurality of portions or may have cutouts. The configuration in which "the optical sensor section 40 is surrounded by the solar battery 80" can be defined as follows: A line segment is drawn from an arbitrary point on the outer edge of the solar battery 80 to another arbitrary point on the outer edge, and the line segment overlaps with the solar battery 80 in the plan view in the +Z-axis direction.

At least part of the optical sensor section 40 is preferably so disposed as to overlap with the center of gravity G of the solar battery 80 in the plan view in the +Z-axis direction, as shown in FIG. 5A. The arrangement of the optical sensor section 40 and the solar battery 80 allows good balance of the apparatus body 30 (position of center of gravity), whereby the apparatus body 30 can be worn on the user in an improved manner. The center of gravity G can be in other words expressed by the center of mass, and in the case of a three-dimensional object, the center of gravity is defined in the structure of the three-dimensional object or defined in the space thereof in some cases. The configuration in which "at least part of the optical sensor section is overlaps with the center of gravity" can be defined as a state in which they overlap with each other when viewed in a predetermined direction and in a case where the position of the center of gravity is projected on a two-dimensional flat surface or a predetermined target object.

The display section 50 is configured to allow the user to visually recognize, via the windshield 55, a numeral or an icon displayed on a display element, such as the display panel 60 provided immediately below the windshield 55, a time displaying hand, or any other piece of displayed information. That is, in the present embodiment, detected biological information, information representing a detected activity state, time information, or any of a variety of other pieces of information is displayed by using the display panel 60, and the displayed information is presented to the user on the front side of the display section 50 (in +Z-axis direction). As the display element, the display panel 60, which is a liquid crystal display, can be replaced, for example, with an organic electro-luminescence (EL) display, an electrophoretic display (EPD), or an LED (light emitting diode) display.

The illuminator 61 functions as a backlight that illuminates the display panel 60. The illuminator 61 is connected to the front surface 20*f*, which serves as the first surface, of the circuit substrate 20. Since the illuminator 61 is connected to the circuit substrate 20 as described above, the lengths of routed wiring lines for the connection between the illuminator 61 and the circuit substrate 20 can be minimized, and the circuit substrate 20 blocks the light outputted from the illuminator 61, whereby the influence of the stray light on the optical sensor section 40 can be reduced.

The secondary battery 70, specifically, the positive and negative terminals thereof are connected to the circuit substrate 20, for example, via a connection substrate (not shown) and supplies a power supply controlling circuit with electric power. The secondary battery 70 is electrically connected to the solar battery 80 via the circuit substrate 20. The electric power is converted by the power supply controlling circuit into predetermined voltage or otherwise processed and supplied to each circuit in the apparatus body 30 to operate, for example, the circuit that drives the optical sensor section 40 to detect the pulse, the circuit that drives the display panel 60, the control circuit that controls the circuits described above (CPU 21). The secondary battery 70 is charged via a pair of charging terminals electrically continuous with the circuit substrate 20 with the aid of a conducting member (not shown), such as a coil spring, or by using the electric power generated by the solar battery 80.

The secondary battery 70 is preferably disposed in a position where the secondary battery 70 does not overlap with the solar battery 80 in the plan view in the +Z-axis direction. When the secondary battery 70 is disposed in a position where the secondary battery 70 does not overlap with the solar battery 80 in the plan view in the +Z-axis direction, the solar battery 80 is unlikely to be affected by heat generated when the secondary battery 70 is charged, so that an increase in the temperature of the solar battery 80 can be suppressed, whereby the power generation efficiency of the solar battery 80 can be increased.

The solar battery (solar cell) 80 uses the photovoltaic effect to convert the optical energy of outside light, such as sunlight, into electric power for power generation. The solar battery 80 in the present embodiment is disposed between the windshield 55 and the display panel 60 and disposed in the form of four divided panels, and the light receiving surfaces 80*a*, 80*b*, 80*c*, and 80*d* of the panels are so disposed as to be oriented in the +Z-axis direction. The solar battery 80 is located in an outer circumferential portion including the outer edge of the display panel 60 (outer edge portion of display section 50), in other words, located on the outer circumferential side of the case 31 and has what is called an annular shape (ring-like shape) having a through hole at a central portion.

Specifically, the solar battery 80 is located in a position close to the opening section 31*s* of the case 31, and has a circular outer circumference 80*os* along the opening section 31*s*, a circular inner circumference 80*is*, the perimeter of which is shorter than that of the outer circumference 80*os*, and sets of two side edges 80*ss* connecting the outer circumference 80*os* and the inner circumference 80*is* to each other on opposite sides of each of the panels that form the solar battery 80, and is disposed above an outer circumferential portion of the display panel 60, as shown in FIG. 5A. That is, the panels having the light receiving surfaces 80*a*, 80*b*, 80*c*, and 80*d* also each have an inner circumference the perimeter of which is shorter than that of the outer circumference. In other words, it can be said that the concentric circle of the solar battery 80 having a shorter radius is the inner circumference and the concentric circle of the solar battery 80 having a longer radius is the outer circumference in the plan view in the +Z-axis direction. The solar battery 80 in the present embodiment is so configured that the four panels having the light receiving surfaces 80*a*, 80*b*, 80*c*, and 80*d* are arranged along the opening section 31*s* of the case 31. The outer circumferences 80*os* and the inner circumferences 80*is* of the four panels, which forms the solar battery 80, may be summed to form the outer circumference and the inner circumference of the solar battery 80. The arrangement of the annular solar battery 80 allows, for example, efficient arrangement of the display area of the display section 50, whereby the exterior appearance of the wrist apparatus 200 can be improved.

In the configuration described above, the annular solar battery 80 formed of the four panels is presented by way of example. The solar battery 80 may instead be formed of a unitary panel. In the case where the solar battery 80 is formed of a plurality of panels, the number of panels can be an arbitrary number. Further, the solar battery 80 may be formed of a film instead of a panel.

Figure 5B:
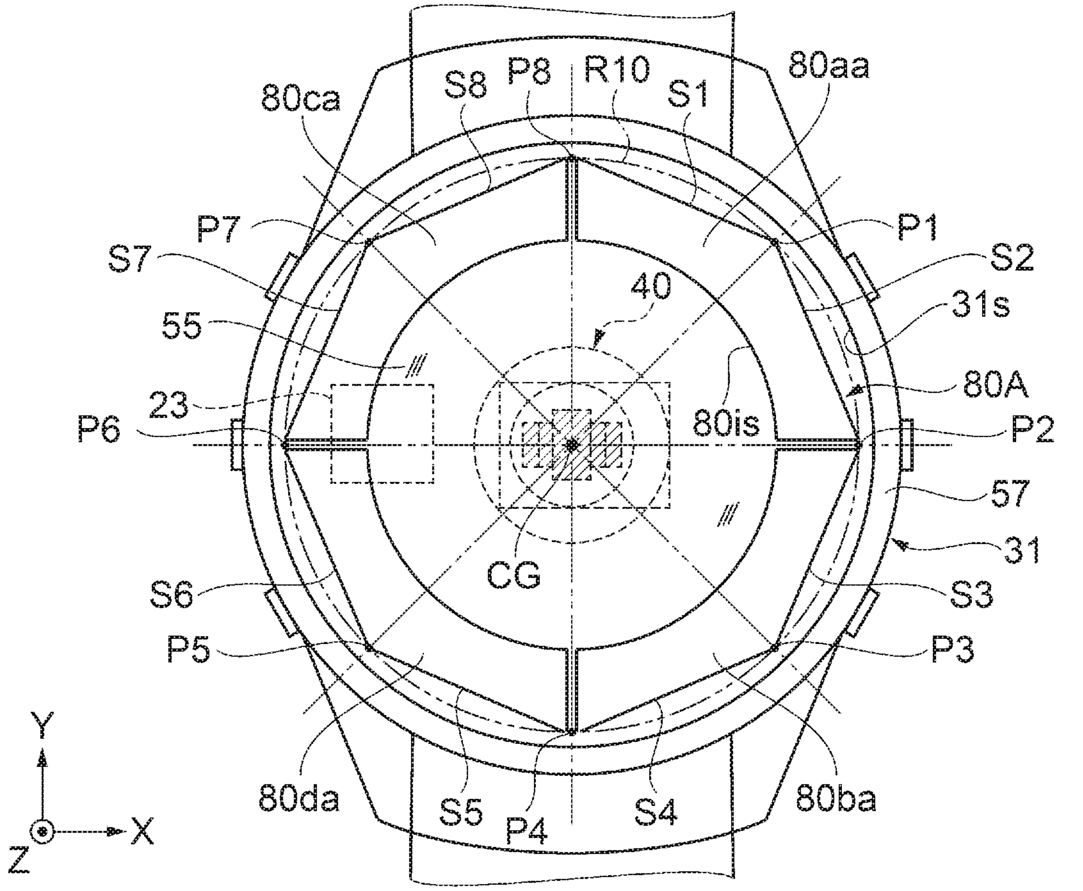
FIG. 5B is a plan view showing Variation 1 of panels of a solar battery.

The panels that form the solar battery 80 may have any shape that does not compromise the visibility of the display section 50 or the exterior appearance of the wrist apparatus 200. Examples of the shape of the panels will be described as variations shown in FIGS. 5B and 5C. FIG. 5B is a plan view showing Variation 1 of the panels of the solar battery, and FIG. 5C is a plan view showing Variation 2 of the panels of the solar battery.

A solar battery 80A according to Variation 1 shown in FIG. 5B by way of example is formed of panels having light receiving surfaces 80*aa*, 80*ba*, 80*ca*, and 80*da* with the outer circumference of each of the panels halved, and the solar battery 80A as a whole has linear outer circumferential edges s1, s2, s3, s4, s5, s6, s7, and s8, which are equally divided eight circumferential edges. Specifically, the outer circumferential edges s1, s2, s3, s4, s5, s6, s7, and s8 are straight lines that connect points p1, p2, p3, p4, p5, p6, p7, and p8 to each other, which equally divide an imaginary line R10, which is a circle around the center CG of the opening section 31*s* and concentric with the inner edge of the opening section 31*s*, into eight segments. For example, in the case of the panel having the light receiving surface 80*aa*, the straight line that connects the point P8, which is located in a 12-o'clock position, to the point p1, which is the first dividing point, form the outer circumferential edge s1, and the straight line that connects the point p1 to the point p2, which is the following dividing point, form the outer circumferential edge s2. The inner circumference of the solar battery 80A is formed of a roughly concentric circle around the center CG.

Figure 5C:
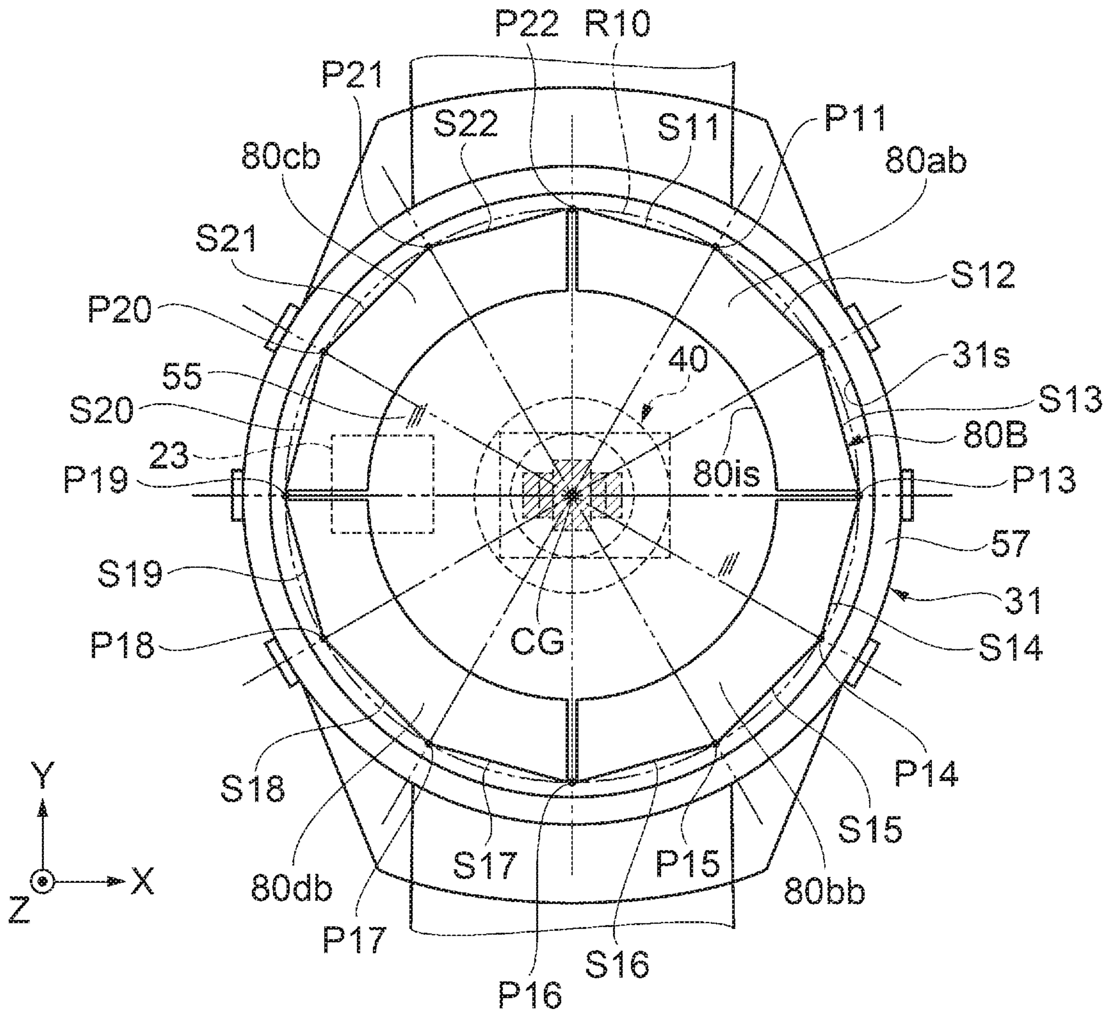
FIG. 5C is a plan view showing Variation 2 of the panels of the solar battery.

A solar battery 80B according to Variation 2 shown in FIG. 5C by way of example is formed of panels having light receiving surfaces 80*ab*, 80*bb*, 80*cb*, and 80*db* with the outer circumference of each of the panels equally divided into three segments, and the solar battery 80B as a whole has linear outer circumferential edges s11, s12, s13, s14, s15, s16, s17, s18, s19, s20, s21, and s22, which are equally divided twelve circumferential edges. Specifically, the outer circumferential edges s11, s12, s13, s14, s15, s16, s17, s18, s19, s20, s21, and s22 are straight lines that connect points p11, p12, p13, p14, p15, p16, p17, p18, p19, p20, p21, and p22 to each other, which equally divide the imaginary line R10, which is a circle around the center CG of the opening section 31*s* and concentric with the inner edge of the opening section 31*s*, into twelve segments. For example, in the case of the panel having the light receiving surface 80*ab*, the straight line that connects the point p22, which is located in a 12-o'clock position, to the point p11, which is the first dividing point, form the outer circumferential edge s11, and the straight line that connects the point p11 to the point p12, which is the following dividing point, form the outer circumferential edge s12. The inner circumference of the solar battery 80B is formed of a roughly concentric circle around the center CG.

In Variations shown in FIGS. 5B and 5C, the inner circumferences of the panels form the inner circumference of the solar battery, and the outer circumference of each of the panels is equally divided into two or three segments. Instead, the inner circumference of each of the panels can be divided into two or three segments. Still instead, the inner and outer circumferences of each of the panels can each be divided into two or three segments. Further, a panel having a linear outer or inner circumference and a panel having no linear outer or inner circumference may be combined with each other.

A storage 180 stores the pulse wave or any other piece of biological information detected by the optical sensor section 40, the position information detected by the GPS reception section 160, the body motion information detected by the body motion sensor section 170, and other pieces of information under the control of the CPU 21.

According to the wrist apparatus 200 described above as the portable electronic apparatus, the acceleration sensor 23 is disposed in a position where at least part of the acceleration sensor 23 overlaps with the solar battery 80, which is disposed in an outer circumferential portion of the case 31, in the plan view in the +Z-axis direction. In other words, the acceleration sensor 23 is disposed in a position separate from the center of gravity of the case 31 in the plan view in the +Z-axis direction. In still other words, the acceleration sensor 23 may be disposed between the outer circumference and the inner circumference of the case 31 in the plan view in the +Z-axis direction. The circuit fixing section 75 and the acceleration sensor 23 are so disposed as to overlap with the solar battery in the plan view in the +Z-axis direction. The acceleration sensor 23, which is disposed in the vicinity of the outer circumference of the case 31, can reliably capture vibration produced when the case 31 is tapped. That is, the acceleration sensor 23 can reliably sense the tapping operation performed on the case 31. Further, the arrangement in which solar battery 80 is disposed in an outer circumferential portion of the case 31 allows increase in the light receiving area of the solar battery 80 and hence increase in the amount of generated electric power while preventing decrease in the wearability of the wrist apparatus 200 due to degradation in the balance of the exterior appearance of the wrist apparatus 200, whereby measurement failure, necessity of charging operation, and other problems due to an insufficient amount of electric power left in the power supply (secondary battery 70) can be avoided.

3.1. Variations of Arrangement of Solar Battery and Acceleration Sensor

Figure 9:
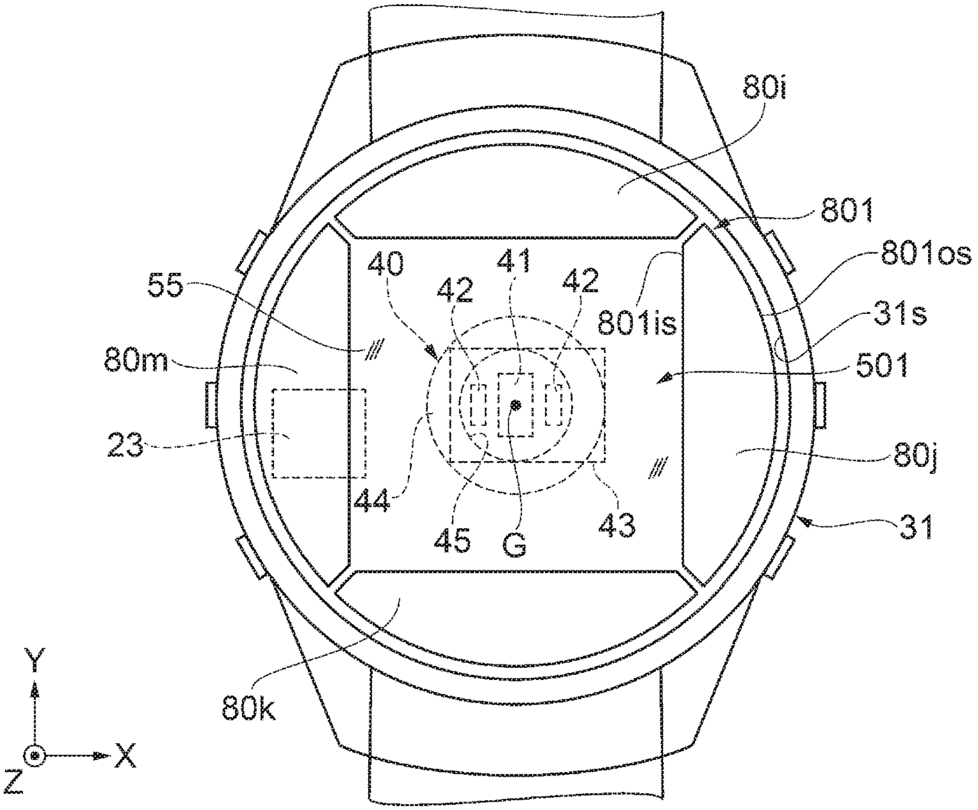
FIG. 9 is a plan view showing Variation 1 of the arrangement of the solar battery and an acceleration sensor.
Figure 10:
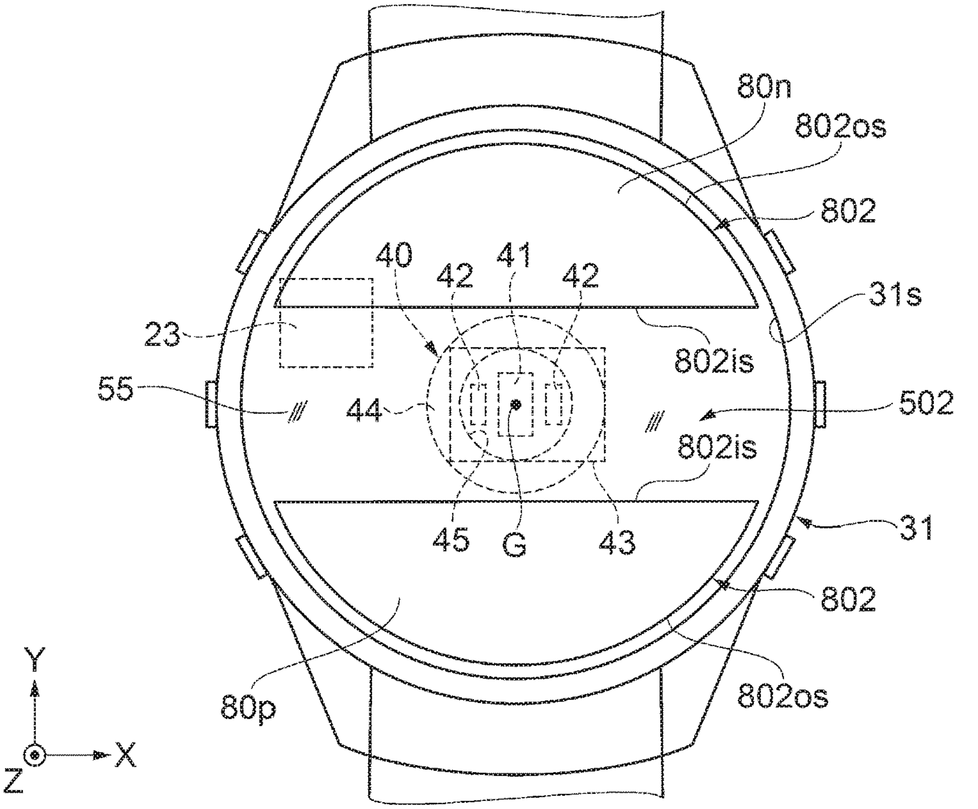
FIG. 10 is a plan view showing Variation 2 of the arrangement of the solar battery and the acceleration sensor.
Figure 11:
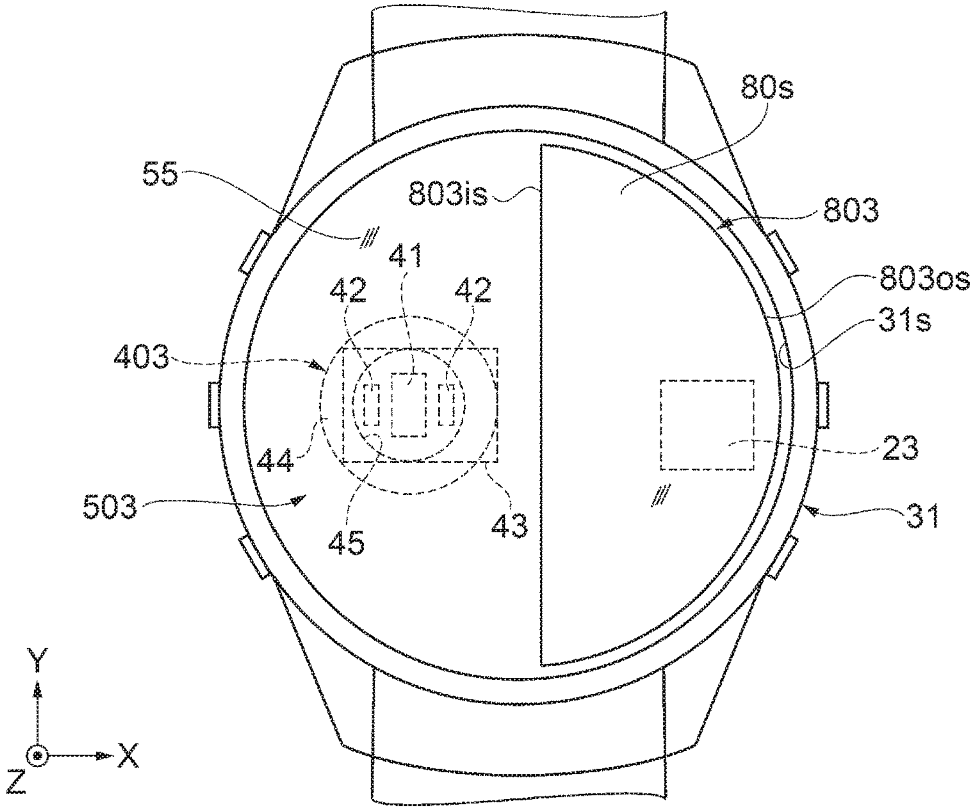
FIG. 11 is a plan view showing Variation 3 of the arrangement of the solar battery and the acceleration sensor.
Figure 12:
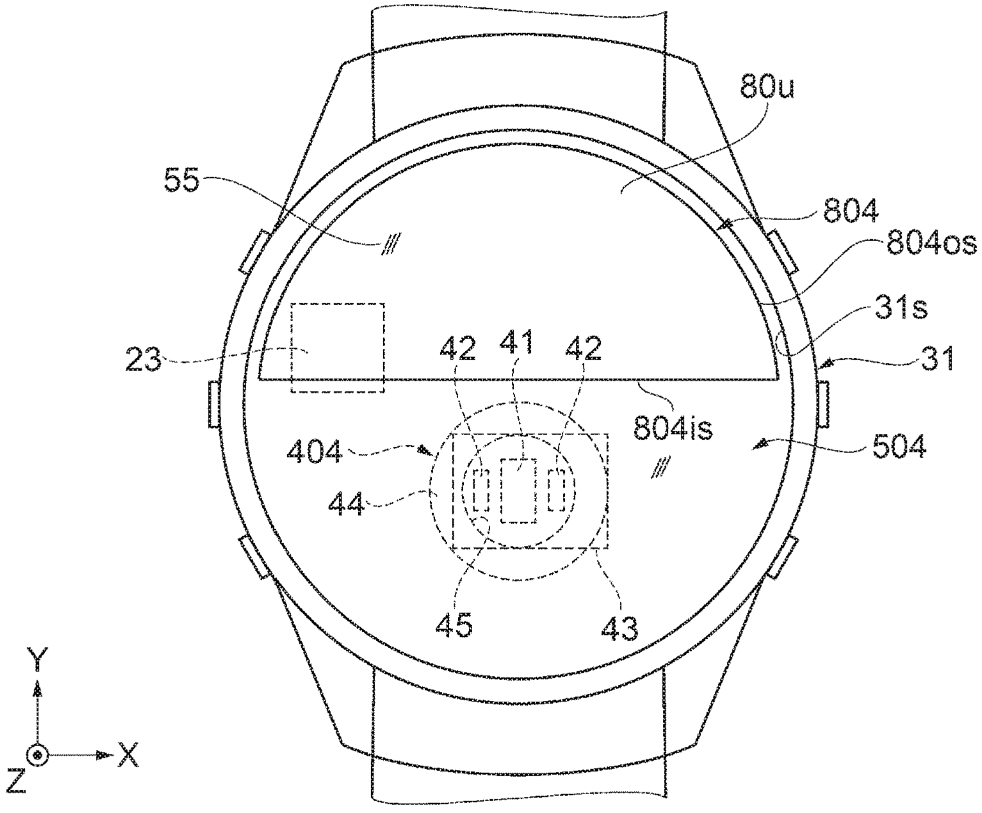
FIG. 12 is a plan view showing Variation 4 of the arrangement of the solar battery and the acceleration sensor.

The above description has been made with reference to the configuration in which the annular solar battery 80 is disposed on the side facing the outer edge of the display panel 60 and the acceleration sensor 23 is disposed in a position whereat least part of the acceleration sensor 23 overlaps with the solar battery 80 in the plan view in the +Z-axis direction, but the arrangement of the solar battery 80 and the acceleration sensor 23 is not limited to the arrangement described above. The arrangement and configuration (shape) of the solar battery 80 and the arrangement of the acceleration sensor 23 can be changed, for example, as will be described below. It is, however, noted that the solar battery 80 and the acceleration sensor 23 is not necessarily arranged and configured as follows and can be arranged and configured in other ways. Variations 1 to 4 of the arrangement of the solar battery 80 and the acceleration sensor 23 will be sequentially described below with reference to FIGS. 9 to 12. FIGS. 9 to 12 are plan views showing the variations of the arrangement of the solar battery and the acceleration sensor. FIG. 9 shows Variation 1, FIG. 10 shows Variation 2, FIG. 11 shows Variation 3, and FIG. 12 shows Variation 4.

Variation 1

Variation 1 of the arrangement of the solar battery and the acceleration sensor will first be described with reference to FIG. 9. A solar battery 801 according to Variation 1 is present between the windshield 55 and the display panel 60 (see FIG. 4) and disposed in the form of four divided panels in positions angularly shifted by about 45 degrees from the X and Y axes, and light receiving surfaces 80*i*, 80*j*, 80*k*, and 80*m* of the panels are so disposed as to be oriented in the +Z-axis direction, as shown in FIG. 9. The solar battery 801 has an outer circumference 801*os*, which extends along the opening section 31*s* of the case 31, and an inner circumference 801*is*, the perimeter of which is shorter than that of the outer circumference 801*os*, and is disposed above an outer circumferential portion of the display panel 60. That is, the panels having the light receiving surfaces 80*i*, 80*j*, 80*k*, and 80*m* also each have an inner circumference the perimeter of which is shorter than that of the outer circumference. The solar battery 801 is so configured that the panels having the light receiving surfaces 80*i*, 80*j*, 80*k*, and 80*m* form a rectangular (roughly square in present example) through hole in a central portion of the case 31. That is, the panels of the solar battery 801 each have an arcuate outer circumference and a roughly linear central circumference, so that a rectangular display section 501 is formed. In the present configuration, the solar battery 801 formed of the four panels is presented by way of example, and the solar battery 801 may instead be formed of a non-divided unitary panel.

The acceleration sensor 23 is disposed in a position where at least part of the acceleration sensor 23 overlaps with the solar battery 801 in the plan view in the +Z-axis direction and attached to a circuit substrate that is not shown. Specifically, part of the acceleration sensor 23 overlaps in the plan view with the panel having the light receiving surface 80*m* out of the panels that form the solar battery 801. In other words, with respect to the center of the display surface, the acceleration sensor 23 is disposed in an −X-axis-side outer circumferential portion of the case 31, that is, in a position close to the outer circumference of the case 31.

The optical sensor section 40 includes at least the sensor substrate 43, to which the light emitters 42 and the light receiver 41 are connected, and is disposed in a central portion of the rectangular (roughly square in present example) through hole of the solar battery 801 in the plan view in the +Z-axis direction. That is, the optical sensor section 40 is so disposed in an inner portion of the case 31 as not to overlap with the solar battery 801 but as to be surrounded by the solar battery 801 in the plan view in the +Z-axis direction. The optical sensor section 40 is further so disposed as to overlap with the center of gravity G of the solar battery 801 in the plan view in the +Z-axis direction. The configuration of the optical sensor section 40 is the same as that described above and will therefore not be described.

According to the arrangement in Variation 1, in which the acceleration sensor 23 is disposed in an outer circumferential portion of the case 31, the acceleration sensor 23 can precisely sense the operation of tapping the case 31. Further, the arrangement in which solar battery 801 is disposed in an outer circumferential portion of the case 31 allows increase in the light receiving area of the solar battery 801 and hence increase in the amount of generated electric power while preventing decrease in the wearability of the wrist apparatus 200 due to degradation in the balance of the exterior appearance of the wrist apparatus 200, whereby an insufficient amount of electric power left in the power supply (secondary battery 70) can be avoided.

Variation 2

Variation 2 of the arrangement of the solar battery and the acceleration sensor will next be described with reference to FIG. 10. A solar battery 802 according to Variation 2 is present between the windshield 55 and the display panel 60 (see FIG. 4) and is formed of two panels each having an arcuate outer edge that forms the outer circumference and a roughly linear straight portion that forms the central circumference, and the two panels are so disposed that the roughly linear straight portions face each other along the X axis and form a display section 502 therebetween, as shown in FIG. 10. Specifically, the solar battery 802 has an outer circumference 802*os*, which extends along the opening section 31*s* of the case 31, and an inner circumference 802*is*, the perimeter of which is shorter than that of the outer circumference 802*os*, and is disposed above an outer circumferential portion of the display panel 60. That is, the panels having light receiving surfaces 80*n* and 80*p* each have an inner circumference the perimeter of which is shorter than that of the outer circumference. The light receiving surfaces 80*n* and 80*p* of the panels that form the solar battery 802 are so disposed as to be oriented in the +Z-axis direction.

The acceleration sensor 23 is disposed in a position where at least part of the acceleration sensor 23 overlaps with the solar battery 802 in the plan view in the +Z-axis direction and attached to a circuit substrate that is not shown. Specifically, the acceleration sensor 23 is so disposed that part thereof overlaps in the plan view with the panel having the light receiving surface 80*n* out of the panels that form the solar battery 802. In other words, the acceleration sensor 23 is disposed in an outer circumferential portion of the case 31, the portion shifted in the +Y-axis direction from the −X axis passing through the center of gravity G of the solar battery 802, that is, in a position close to the outer circumference of the case 31.

The optical sensor section 40 includes at least the sensor substrate 43, to which the light emitters 42 and the light receiver 41 are connected, and is disposed in a central portion of the display section 502 disposed between the two solar batteries 802 in the plan view in the +Z-axis direction. That is, the optical sensor section 40 is disposed in a position where the optical sensor section 40 does not overlap with the solar battery 802 in the plan view in the +Z-axis direction. The optical sensor section 40 is further so disposed as to overlap with the center of gravity G of the solar battery 802 in the plan view in the +Z-axis direction. The configuration of the optical sensor section 40 is the same as that described above and will therefore not be described.

According to the arrangement in Variation 2, in which the acceleration sensor 23 is disposed in an outer circumferential portion of the case 31, the acceleration sensor 23 can precisely sense the operation of tapping the case 31. Further, the arrangement in which solar battery 802 is disposed in an outer circumferential portion of the case 31 allows increase in the light receiving area of the solar battery 802 and hence increase in the amount of generated electric power while preventing decrease in the wearability of the wrist apparatus 200 due to degradation in the balance of the exterior appearance of the wrist apparatus 200, whereby an insufficient amount of electric power left in the power supply (secondary battery 70) can be avoided.

Variation 3

Variation 3 of the arrangement of the solar battery and the acceleration sensor will next be described with reference to FIG. 11. A solar battery 803 according to Variation 3 shown in FIG. 11 is present between the windshield 55 and the display panel 60 (see FIG. 4), is located above an outer edge portion of the display panel 60, and is formed of a single semicircular panel having an arcuate outer edge that forms the outer circumference and a roughly linear outer edge along the Y axis that forms the central circumference. Specifically, the solar battery 803 has an outer circumference 803*os*, which extends along the opening section 31*s* of the case 31, and an inner circumference 803*is*, the perimeter of which is shorter than that of the outer circumference 803*os*, and is disposed above one outer circumferential portion of the display panel 60. The solar battery 803 is disposed on the +X-axis side (3-o'clock side) of the case 31. A display section 503 is therefore disposed on the −X-axis side (9-o'clock side) of the case 31. A light receiving surface 80*s*, which forms the solar battery 803, is so disposed as to be oriented in the +Z-axis direction.

The acceleration sensor 23 is disposed in a position where at least part of the acceleration sensor 23 overlaps with the solar battery 803 in the plan view in the +Z-axis direction and attached to a circuit substrate that is not shown. Specifically, the acceleration sensor 23 is disposed in a +X-axis-side (3-o'clock-side) outer circumferential portion of the case 31, that is, in a position close to the outer circumference of the case 31 so that the acceleration sensor 23 overlaps in the plan view with the light receiving surface 80*s* of the panel that forms the solar battery 803.

An optical sensor section 403 includes at least the sensor substrate 43, to which the light emitters 42 and the light receiver 41 are connected, and the measurement window 45 is disposed in a position shifted from the central portion of the case 31 in the −X-axis direction so that the optical sensor section 403 does not overlap with the solar battery 803 in the plan view in the +Z-axis direction. In the arrangement in which the solar battery 803 is shifted, the optical sensor section 403 can be so disposed as to coincide with the center of gravity G. The optical sensor section 403 is disposed in the position different from the position where the optical sensor section 40 described above is disposed but has the same configuration as that of the optical sensor section 40, and the configuration of the optical sensor section 403 will therefore not be described.

According to the arrangement in Variation 3, in which the acceleration sensor 23 is disposed in an outer circumferential portion of the case 31, the acceleration sensor 23 can precisely sense the operation of tapping the case 31. Further, the arrangement in which solar battery 803 is disposed in an outer circumferential portion of the case 31 allows increase in the light receiving area of the solar battery 803 and hence increase in the amount of generated electric power while preventing decrease in the wearability of the wrist apparatus 200 due to degradation in the balance of the exterior appearance of the wrist apparatus 200, whereby an insufficient amount of electric power left in the power supply (secondary battery 70) can be avoided.

According to the arrangement in Variation 3, when the apparatus 200 is worn on the user's wrist, the +X-axis side (3-o'clock side) of the case 31 is located on the side facing the user's fingertips in many cases and is therefore unlikely to be covered with the user's clothes (sleeve). Therefore, the arrangement of the solar battery 803 on the +X-axis side (3-o'clock side) of the case 31 allows increase in sunlight reception probability, whereby electric power can be generated more efficiently.

Variation 4

Variation 4 of the arrangement of the solar battery and the acceleration sensor will next be described with reference to FIG. 12. A solar battery 804 according to Variation 4 shown in FIG. 12 is present between the windshield 55 and the display panel 60 (see FIG. 4), is located in a portion facing the outer edge of the display panel 60, and is formed of a single semicircular panel having an arcuate outer edge (outer circumference) that forms the outer circumference and a roughly linear outer edge (inner circumference) along the X axis that forms the central circumference. Specifically, the solar battery 804 has an outer circumference 804*os*, which extends along the opening section 31*s* of the case 31, and an inner circumference 804*is*, the perimeter of which is shorter than that of the outer circumference 804*os*, and is disposed in one outer circumferential portion of the display panel 60. The solar battery 804 is disposed on the +Y-axis side (12-o'clock side) of the case 31. A display section 504 is therefore disposed on the −Y-axis side (6-o'clock side) of the case 31. A light receiving surface 80*u*, which forms the solar battery 804, is so disposed as to be oriented in the +Z-axis direction.

The acceleration sensor 23 is disposed in a position where at least part of the acceleration sensor 23 overlaps with the solar battery 804 in the plan view in the +Z-axis direction and which is close to the outer circumference of the case 31, and the acceleration sensor 23 is attached to a circuit substrate that is not shown. Specifically, the acceleration sensor 23 is disposed in a −X-axis-side (9-o'clock-side) outer circumferential portion of the case 31 so that part of the acceleration sensor 23 overlaps in the plan view with a light receiving surface 80*u* of the panel that forms the solar battery 804.

An optical sensor section 404 includes at least the sensor substrate 43, to which the light emitters 42 and the light receiver 41 are connected, and the measurement window 45 is disposed in a position shifted from the central portion of the case 31 in the −Y-axis direction so that the optical sensor section 404 does not overlap with the solar battery 804 in the plan view in the +Z-axis direction. The optical sensor section 404 is disposed in the position different from the position where the optical sensor section 40 described above is disposed but has the same configuration as that of the optical sensor section 40, and the configuration of the optical sensor section 404 will therefore not be described.

According to the arrangement in Variation 4, in which the acceleration sensor 23 is disposed in an outer circumferential portion of the case 31, the acceleration sensor 23 can precisely sense the operation of tapping the case 31. Further, the arrangement in which solar battery 804 is disposed in an outer circumferential portion of the case 31 allows increase in the light receiving area of the solar battery 804 and hence increase in the amount of generated electric power while preventing decrease in the wearability of the wrist apparatus 200 due to degradation in the balance of the exterior appearance of the wrist apparatus 200, whereby an insufficient amount of electric power left in the power supply (secondary battery 70) can be avoided.

The aforementioned embodiment has been described with reference to the case where the GPS using the GSP satellites 8 are presented as position information satellites provided in a global navigation satellite system (GNSS) as an example of the positioning system using position information satellites, but the GPS is merely an example. The global navigation satellite system may be Galileo (EU), GLONASS (Russia), Hokuto (China), or any other system and only needs to be a system including position information satellites that each issue a satellite signal, such as SBAS or any other stationary satellite or a quasi-zenith satellite. That is, the apparatus 200 may be configured to acquire any one of date information, time information, position information, and speed information obtained by processing electric waves (wireless signals) from position information satellites including satellites other than the GPS satellites 8. The global navigation satellite system can be a regional navigation satellite system (RNSS).

What is claimed is:

1. A portable electronic apparatus comprising:

a case;

an annular solar battery provided in the case;

an acceleration sensor provided on a circuit substrate having an outer circumference that is supported by the case and disposed in a position where the acceleration sensor overlaps with the annular solar battery in a plan view along a normal to a light receiving surface of the annular solar battery; and a secondary battery provided on a side of the circuit substrate opposing the acceleration sensor and electrically connected to the annular solar battery, wherein the acceleration sensor is disposed outside an outer edge of a biological information measuring section and the secondary battery does not overlap with the annular solar battery and acceleration sensor in the plan view.

2. The portable electronic apparatus according to claim 1, wherein the circuit substrate is electrically connected to the acceleration sensor, and the circuit substrate is so supported that an outer circumference thereof is supported by the case.

3. The portable electronic apparatus according to claim 2, wherein the acceleration sensor is mounted on the circuit substrate and disposed in a portion facing the outer circumference of the circuit substrate.

4. The portable electronic apparatus according to claim 1, wherein the annular solar battery has an annular shape in the plan view.

5. The portable electronic apparatus according to claim 1, wherein the circuit substrate is provided in the case, the circuit substrate has a first surface and a second surface so related to the first surface that the first and second surfaces are front and rear surfaces of the circuit substrate, the acceleration sensor and an illuminator are provided on the first surface, and a biological information measuring section that measures biological information is provided on the second surface.

6. A portable electronic apparatus comprising:

a case;

an annular solar battery provided in the case;

a circuit substrate having an outer circumference that is supported by the case;

an acceleration sensor mounted on the circuit substrate and disposed in a position where the acceleration sensor overlaps with the annular solar battery in the plan view; and a secondary battery provided on a side of the circuit substrate opposing the acceleration sensor and electrically connected to the annular solar battery, wherein the acceleration sensor is disposed outside an outer edge of a biological information measuring section and the secondary battery does not overlap with the annular solar battery and acceleration sensor in the plan view, the acceleration sensor being electrically connected to the circuit substrate.

* * * * *